US010074735B2

(12) United States Patent
Harrington, III et al.

(10) Patent No.: US 10,074,735 B2
(45) Date of Patent: Sep. 11, 2018

(54) SURFACE DEVICES WITHIN A VERTICAL POWER DEVICE

(71) Applicant: D3 Semiconductor LLC, Addison, TX (US)

(72) Inventors: Thomas E. Harrington, III, Carrollton, TX (US); Zhijun Qu, Frisco, TX (US)

(73) Assignee: D3 Semiconductor LLC, Addison, TX (US)

( * ) Notice: Subject to any disclaimer, the term of this patent is extended or adjusted under 35 U.S.C. 154(b) by 0 days.

(21) Appl. No.: 15/694,320

(22) Filed: Sep. 1, 2017

(65) Prior Publication Data

US 2018/0012981 A1 Jan. 11, 2018

Related U.S. Application Data

(63) Continuation of application No. 15/055,333, filed on Feb. 26, 2016, now Pat. No. 9,755,058.

(60) Provisional application No. 62/126,240, filed on Feb. 27, 2015.

(51) Int. Cl.
| | | |
|---|---|---|
| H01L 27/02 | (2006.01) | |
| H01L 29/739 | (2006.01) | |
| H01L 27/06 | (2006.01) | |
| H01L 27/12 | (2006.01) | |
| H01L 29/06 | (2006.01) | |
| H01L 27/092 | (2006.01) | |
| H01L 29/861 | (2006.01) | |
| H01L 29/872 | (2006.01) | |
| H01L 29/78 | (2006.01) | |

(52) U.S. Cl.
CPC ...... *H01L 29/7395* (2013.01); *H01L 27/0635* (2013.01); *H01L 27/0652* (2013.01); *H01L 27/0922* (2013.01); *H01L 27/1203* (2013.01); *H01L 29/0619* (2013.01); *H01L 29/0634* (2013.01); *H01L 29/7397* (2013.01); *H01L 29/8611* (2013.01); *H01L 29/872* (2013.01); *H01L 29/78* (2013.01); *H01L 29/7833* (2013.01)

(58) Field of Classification Search
CPC . H01L 27/06; H01L 27/1205; H01L 27/0635; H01L 27/0652
See application file for complete search history.

(56) References Cited

U.S. PATENT DOCUMENTS

| | | | |
|---|---|---|---|
| 5,578,841 A | 11/1996 | Vasquez et al. | |
| 6,072,215 A | 6/2000 | Kawaji et al. | |
| 6,127,701 A * | 10/2000 | Disney | H01L 27/0623 257/327 |
| 2004/0056306 A1 | 3/2004 | Saito et al. | |
| 2007/0138648 A1 | 6/2007 | Vinn et al. | |
| 2008/0252372 A1* | 10/2008 | Williams | H01L 27/092 330/251 |
| 2008/0266922 A1 | 10/2008 | Mumtaz et al. | |
| 2012/0161286 A1 | 6/2012 | Bhalla | |
| 2012/0235227 A1* | 9/2012 | Otremba | H01L 23/3735 257/329 |

(Continued)

*Primary Examiner* — Phuc Dang
(74) *Attorney, Agent, or Firm* — Schultz & Associates, P.C.

(57) ABSTRACT

A semiconductor device comprises a vertical power device, such as a superjunction MOSFET, an IGBT, a diode, and the like, and a surface device that comprises one or more lateral devices that are electrically active along a top surface of the semiconductor device.

17 Claims, 24 Drawing Sheets

(56) References Cited

U.S. PATENT DOCUMENTS

| | | | |
|---|---|---|---|
| 2012/0313163 A1* | 12/2012 | Fukui | H01L 29/41741 257/330 |
| 2013/0035005 A1 | 2/2013 | Hau et al. | |
| 2013/0037852 A1 | 2/2013 | Tamaki | |
| 2013/0037906 A1 | 2/2013 | Hirler et al. | |
| 2013/0249001 A1 | 9/2013 | Willmeroth et al. | |
| 2014/0084335 A1 | 3/2014 | Senoo et al. | |
| 2014/0094009 A1 | 4/2014 | Chih et al. | |
| 2014/0252456 A1* | 9/2014 | Liao | H01L 29/66712 257/329 |
| 2014/0374773 A1* | 12/2014 | Ryu | H01L 27/098 257/77 |
| 2015/0179637 A1 | 6/2015 | Pfirsch et al. | |

\* cited by examiner

SURFACE DEVICES WITHIN A VERTICAL POWER DEVICE

CROSS-REFERENCE TO RELATED APPLICATIONS

This application is a continuation of U.S. application Ser. No. 15/055,333, filed Feb. 26, 2016, which claims priority to U.S. Provisional Application No. 62/126,240 filed Feb. 27, 2015. Each of the applications identified above is incorporated herein by reference in its entirety to provide continuity of disclosure.

FIELD

This disclosure relates generally to method of integrating and embedding many types of surface devices (e.g., NMOS, PMOS, etc.) within a vertical power device die. In particular, this disclosure details methods and designs for integrating and embedding surface devices within a vertical power device by either designing a topmost surface doping region that is capable of hosting a variety of surface devices while simultaneously designing the power device conducting regions to be capable of maintaining a specified breakdown voltage, or by designing the power devices and the variety of surface devices to be compatible with a fully electrically isolated silicon-on-insulator architecture.

BACKGROUND

The need to reduce system cost, provide greater functionality, and enable higher levels of precision and efficiency are continually pushing semiconductors towards higher levels of integration. Many applications would benefit from the integration of one or more vertical power devices with logic, analog, and mixed-signal circuitry including sensors within a single die. The benefits include reduced product cost due to integration, enabling of higher functionality, improved component matching, and improved thermal matching due to the shared substrate.

Vertical power devices such as superjunction MOSFETs, IGBTs, and diodes are used in numerous power applications, one example being MOSFETs in switch-mode power supplies. Many of these applications require external circuitry to allow the control circuitry (e.g., a microprocessor) to interface with these power devices in an optimal way. For example, many applications require a separate gate driver IC to interface between the control circuitry and the power device in order to provide the power device with the gate voltages it requires to switch optimally. To reduce system cost, provide greater functionality, and enable greater precision and efficiency, it would be advantageous to be able to embed various types of control circuitry within the power device die. The present disclosure provides a method of integrating and embedding many types of surface devices (e.g., NMOS, PMOS, etc.) within a vertical device die.

DETAILED DESCRIPTION

Figure 1:
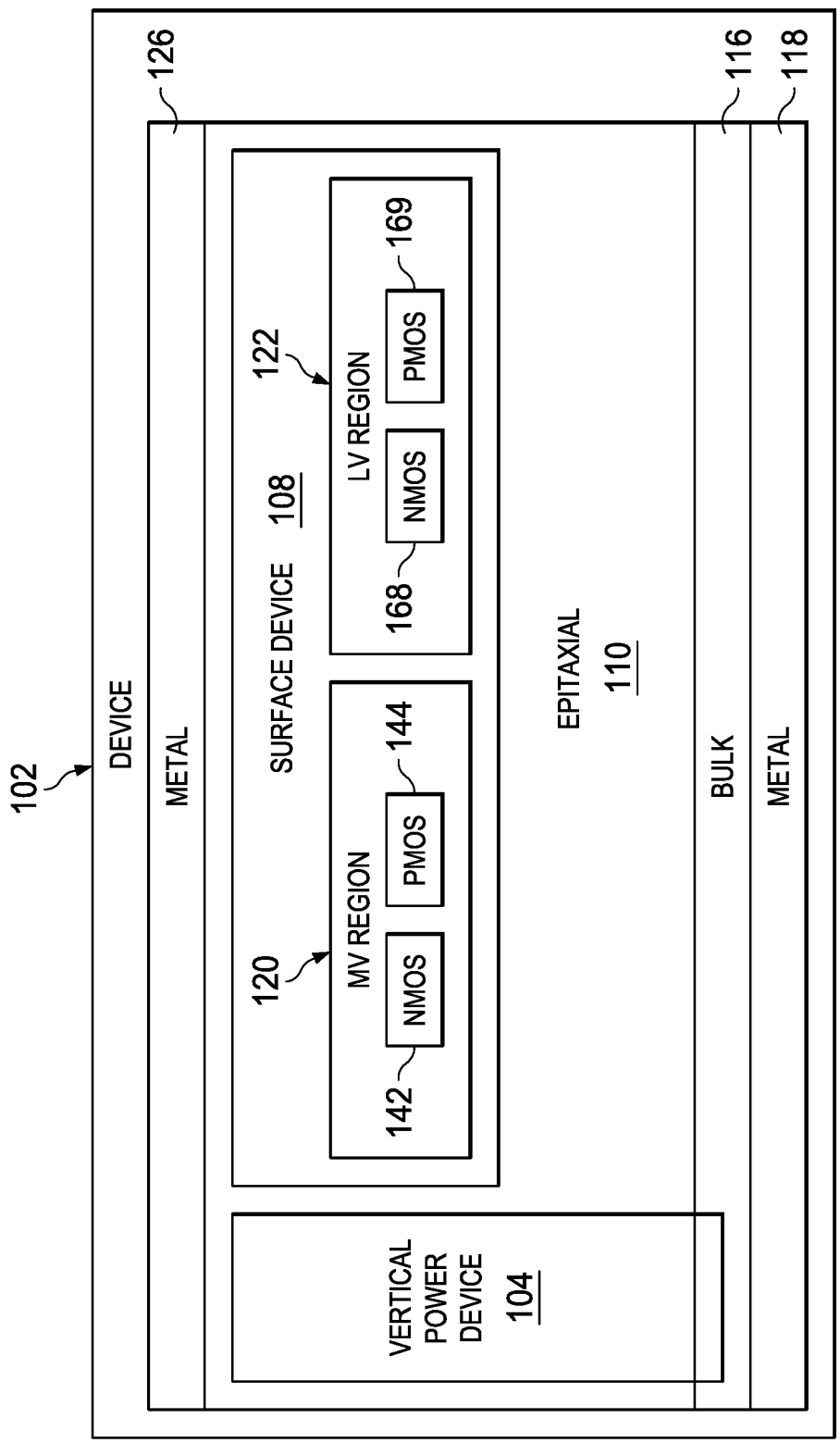
FIG. 1 is a block diagram of a device that includes a vertical power device and a mixed signal surface device in accordance with the disclosure.

While the making and using of various embodiments of the present disclosure are discussed in detail below, it should be appreciated that the present disclosure provides many applicable inventive concepts that can be embodied in a wide variety of specific contexts. The specific embodiments discussed herein are merely illustrative of specific ways to make and use the invention and do not limit the scope of the invention.

Vertical power devices such as MOSFETs, IGBTs, and diodes are semiconductor constructs where the primary direction of current flow inside the device is vertical, that is, from top to bottom or bottom to top or both. Additionally, vertical superjunction devices such as the superjunction MOSFET employ charge balance between alternating n-type and p-type regions to achieve a lower on-resistance (RON) and higher breakdown voltage (BV) than would be possible without charge balance. The construction of IGBTs and diodes does not routinely employ a charge balance architecture but may do so when advantageous from a power efficiency standpoint.

In contrast to vertical power devices, semiconductor device elements used for constructing logic circuits, analog circuits, mixed-signal circuits, and memory circuits, collectively referred to here as "circuit elements", are mainly top surface devices. These devices employ lateral current flow within a few microns of the top surface (e.g., an NMOS transistor with top surface source, gate, and drain terminals), lateral current flow above the top surface (polysilicon or thin-film resistors), or vertical current flow only within a few microns (usually 5 um or less) of the surface which is collected at the surface (current flows vertically, then laterally, then back vertically in order to be collected at the surface) and does not flow from the top surface to the bottom surface or from the bottom surface to the top surface (e.g., an NPN bipolar transistor with top surface emitter, base, and collector terminals). This class of top surface device constructs also includes top surface capacitive elements, and above top surface capacitive and inductive elements, as well as charging-trapping non-volatile memory elements like EPROM, EEPROM, and Flash EEPROM.

A preferred embodiment includes a vertical current flow power MOSFET, IGBT, or diode implemented in epitaxial on bulk silicon that has a top-surface doping region that is capable of hosting various surface type circuit elements. The top surface doping region is designed so that it is deep enough to contain embedded wells of lesser and greater net doping levels, both of the same doping type and of the opposite doping type, and at the same time the underlying power device drift regions (with or without superjunction charge balance regions) are designed to be tall enough to still support the required breakdown voltage of the vertical power device. This top-surface doping region will be referred to as a MV-Pwell (medium-voltage p-type well). Since this MV-Pwell region is located at the surface of the vertical device and is electrically connected to the low-side voltage of the power device, and since the high-side voltage of the power device is applied to the backside of the vertical construction and this high-side voltage is dropped from bottom to top of the vertical device, the MV-Pwell region is effectively biased at a potential of zero volts. The MV-Pwell region can therefore be drawn to span the power device drift regions (including alternating p-type and n-type superjunction columns in the case of a superjunction MOSFET) and can act as a doping well host for an opposite doping type well so that both conductivity type devices (lateral, surface NMOS and PMOS of varying voltage capabilities) and bipolar transistors can be embedded within the MV-Pwell region.

Integration of vertical power devices with logic, analog, non-volatile memory, and mixed-signal circuitry (surface devices) can be accomplished using an epitaxial on bulk silicon substrate as described in the preferred embodiment, but it can also be accomplished using an SOI (silicon-on-insulator) substrate. The alternative embodiment using an SOI substrate is a vertical current flow power MOSFET, IGBT, or diode that is laterally isolated from neighboring surface type circuit regions or even additional vertical current flow power MOSFET, IGBT, or diode regions by insulation-filled trenches that span the power device drift region, intersect the bottom insulator of the SOI, and provide full dielectric isolation for each device region. Access to the high voltage terminal of each vertical power device is obtained by backside patterning and etching of any handle wafer (if utilized) and the SOI insulator within the region of the high voltage terminal. For a MOSFET, any handle wafer (if utilized) as well as the SOI insulator is patterned and etched over each drain region, and a backside metallization is deposited, patterned, and etched to remain over each MOSFET drain region. For an IGBT, any handle wafer (if utilized) as well as the SOI insulator is patterned and etched, a p+ implant is performed and annealed, and a backside metal is deposited, patterned, and etched to remain in each of the IGBT collector regions. For a diode, any handle wafer (if utilized) as well as the SOI insulator is patterned and etched over each cathode region, and a backside metallization is deposited, patterned, and etched to remain over each diode cathode region.

A detailed example SOI process implementation of a superjunction MOSFET with adjacent dielectrically isolated surface device regions is described below. The starting SOI can be of any type, for example, the wafer bonding with a separation technique (using hydrogen implantation like Smart Cut™ or other separation techniques), or the oxygen implantation technique like Separation by Implantation of Oxygen (SIMOX). Most implementations of SOI today use relatively thin silicon (several microns) on top of the insulator, so the implementation for integrated power devices is usually for fully dielectrically isolated lateral high voltage devices (e.g., lateral diffused MOS (LDMOS)) or for vertical power devices with a topside contact to the drain (MOSFET), collector (IGBT) or cathode (diode), and not for vertical power devices with a backside contact to the drain (MOSFET), collector (IGBT) or cathode (diode).

An example process flow for building a vertical superjunction MOSFET on an SOI wafer constructed using a wafer bonding technique would be as follows:

1) Start with a bulk Si wafer with low n-type doping (less than 1E16 atoms/cm$^3$).

2) Before using this starting bulk Si wafer to construct the SOI base wafer using a wafer bonding technique, implant the starting Si wafer with the N+ arsenic doping (dose equal to or greater than 2E15 atoms/cm$^2$) that will later form the heavily-doped drain of the superjunction MOSFET.

3) Grow SiO$_2$ on the heavily-doped N+ wafer surface and complete construction of the SOI base wafer in the normal fashion of the chosen wafer bonding SOI fabrication technique.

4) For a multiple-epitaxial deposition superjunction implementation, build up the superjunction p-type columns onto the topside of the SOI wafer by depositing multiple epitaxial layers and performing a masked p-type implant or implants into each epitaxial layer.

5) For a trench superjunction implementation, deposit the full thickness of superjunction epitaxy in one deposition onto the topside of the SOI wafer, etch trenches, and form the superjunction by, e.g., refilling the trench with selective p-type epitaxy, or implanting the sidewalls with p-type dopant and refilling the trenches with SiO$_2$ or a combination of SiO$_2$ and polysilicon, and so forth.

6) In both multiple-epitaxial and trench superjunction implementations, etch deep trenches (distinct from the superjunction trenches in the trench superjunction implementation) which extend down to the bottom SOI isolation oxide and post-etch fill these trenches with an oxide to dielectrically isolate the superjunction power device area(s) from the CMOS, bipolar, non-volatile memory, and other mixed-signal areas (that is, the surface device areas).

7) After front-side processing is complete:

a) Grind down all or a portion of the thickness of the backside handle wafer. Subsequent processing requires the ability to handle thin wafers (10 mils or less).

b) Over only the superjunction area, pattern and etch the remaining portion of the backside handle wafer thickness (if any) and the isolation oxide on the backside, in order to expose the backside heavily-doped N+ drain silicon.

c) Deposit backside metal(s) in order to make electrical contact to the backside drain silicon.

d) To form multiple dielectrically isolated vertical superjunction MOSFETs, the backside metallization is patterned to separate each independent drain connection. It may be necessary to deposit an insulating layer between the patterning and etching of the backside handle wafer and the patterning and etching of the SOI isolation oxide so that the subsequent backside metal deposition does not come into contact with the handle wafer which might make endpointing of the backside metal etch difficult. Additionally, in order to package a configuration with multiple isolated vertical superjunction MOSFET drains on the backside, the packaging die paddle would need to have multiple connection zones.

8) For an SOI configuration as described above, the CMOS, bipolar, non-volatile memory, and other mixed-signal areas (that is, the surface device areas) can each be dielectrically isolated from the vertical power device area(s) and from each other, certain embodiments of which are shown and described in FIGS. 5 through 8B.

With reference to FIG. 1, device 102 includes vertical power device 104 and mixed signal surface device 108.

Vertical power device 104 is formed as a part of epitaxial silicon 110 on bulk silicon 116 and connected to metal 126 and metal 118. Vertical power device 104 includes parallel connected semiconductor devices that form a single high power device, such as an SJMOSFET, an IGBT, a silicon junction diode, a Schottky diode, or a composite device. The height of device 102 between metal 126 and metal 118 is sufficiently tall to support a given breakdown voltage of vertical power device 104. The topmost portion of vertical power device 104 forms part of the topmost doping region of device 102. Vertical power device 104 has a backside connection that does not route the high voltage terminal back to the top surface and instead, brings the high voltage terminal out on the back surface, such as through metal 118. The backside terminal is a primary, high-voltage, current-carrying terminal, such as a drain (MOS), collector (IGBT), or cathode (Diode). The backside terminal is not a parasitic terminal like a parasitic capacitance or a parasitic junction which is not involved in the primary function of the device.

Surface device 108 is a mixed signal device that includes one or more analog devices and digital devices that are formed in or on a top surface of epitaxial silicon 110, which is formed on bulk silicon 116. Surface device 108 includes medium voltage (MV) region 120 and low voltage (LV) region 122. Alternative embodiments use one or more MV regions, one or more LV regions, or a combination of one or more MV regions and LV regions. The electronic circuits that form surface device 108 are electrically active along the top surface of device 102 so that current from surface device 108 does not flow to metal 118 on a bottom or back-side surface of device 102. Surface device 108, along with the topmost portion of vertical power device 104, forms the topmost doping region of device 102. The devices that form surface device 108 are either lateral devices in that they are electrically active along a lateral axis at a top surface of device 102, or are vertical devices (such as an NPN transistor) whose primary electrical activity is confined within the surface device region.

In certain embodiments, the electronic circuits that form surface device 108 are used to control vertical power device 104. In certain embodiments, surface device 108 includes one or more lateral NMOS, lateral PMOS, LDMOS, vertical NPN, vertical PNP, lateral NPN, and lateral PNP transistors. In certain embodiments, the circuits of surface device 108 form one or more EPROM (erasable programmable read-only memory) or EEPROM (electrically erasable programmable read-only memory) non-volatile memory elements. In certain embodiments, surface device 108 includes one or more capacitive, inductive, and resistive elements. Alternative embodiments can have any number or type of electrical components formed in surface device 108, such as transistors, resistors, capacitors, and so on, to form any number of digital or analog components, such as analog to digital converters, digital to analog converters, logic gates, memory, processors, state machines, EPROM, EEPROM, logic gates, and so on.

MV region 120 comprises one or more transistors inside of NMOS region 142 and PMOS region 144. In additional embodiments, certain transistors between NMOS region 142 and PMOS region 144 compliment each other so as to form CMOS logic circuits from simple logic gates and memories to complex state machines and processors.

LV region 122 comprises one or more transistors inside of NMOS region 168 and PMOS region 169. LV region 122 uses lower voltages and smaller transistor sizes than the transistors in MV region 120.

Metal 126 includes one or more layers of metal. The topmost layer of metal is thick (about 2-5 micrometers [µm] thick) in order to carry the current for vertical power device 104.

For the portion of metal 126 that connects surface device 108, metal 126 may include one or more thinner lower metal layers, about 0.3-1.0 µm thick and being closest to the silicon, for dense wiring in MV region 120 and LV region 122. These thinner layers are then topped off with the thick power device metal layer as the topmost metal layer. The thinner layers of metal 126 that are above vertical power device 104 are stacked and include vias to convey the current from the thick topmost metal layer through to the thinner metal layers and finally down to vertical power device 104.

Since a portion of epitaxial silicon 110 on bulk silicon 116 is not carrying current below surface device 108, this portion of epitaxial silicon 110 will have a lower temperature than the portion of the epitaxial silicon 110 that forms vertical power device 104. In certain embodiments, the regions of surface device 108 are strategically placed or interspersed around or within the vertical device areas so as to dissipate the heat from vertical power device 104 and lower the overall temperature of device 102.

Figure 2A:
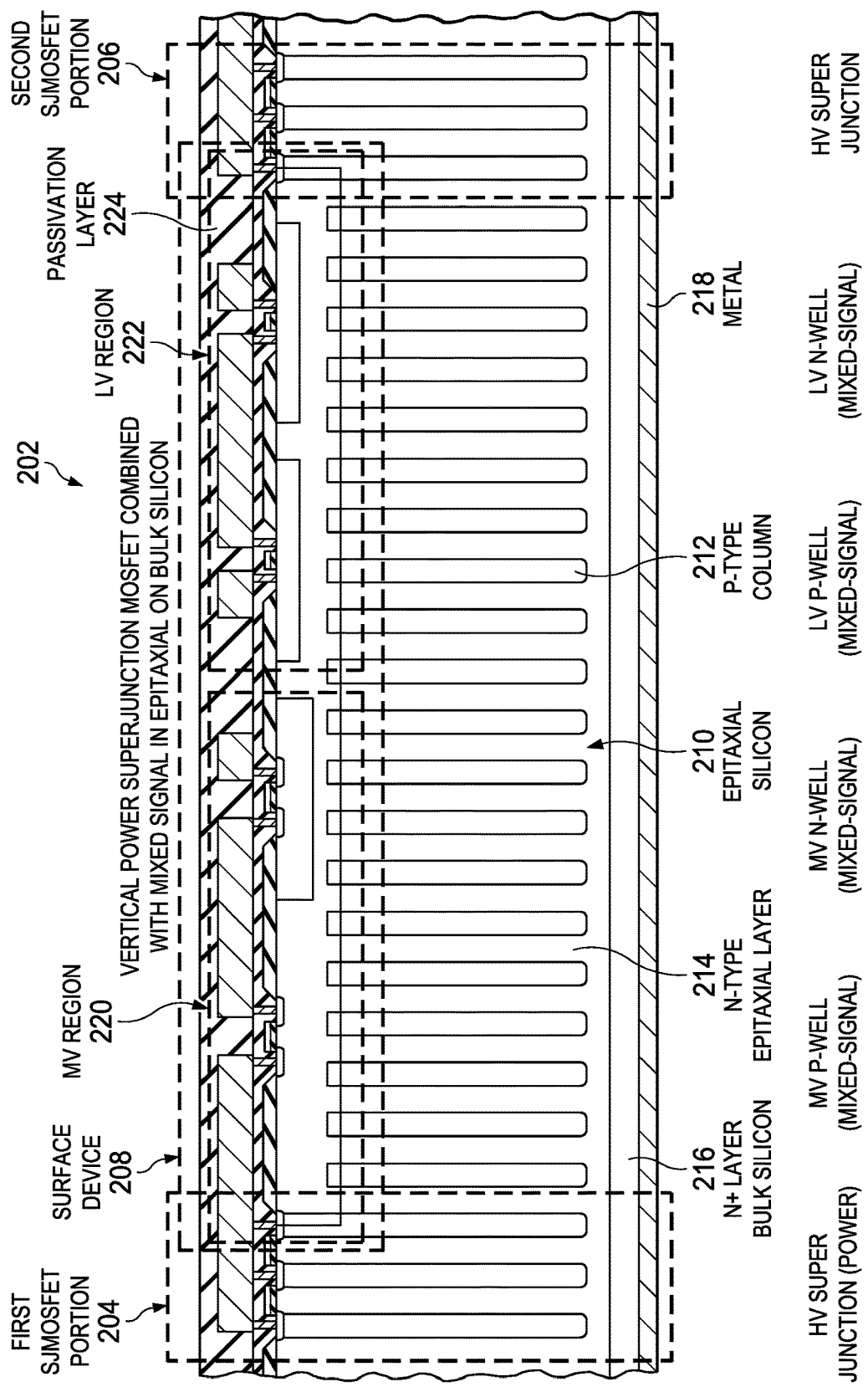
FIG. 2A is a cross section view of a semiconductor device comprising a vertical power superjunction MOSFET (SJ-MOSFET) combined with a mixed signal device in epitaxial on bulk silicon in accordance with the disclosure.

Referring to FIG. 2A, a cross section view is shown of semiconductor device 202 comprising a vertical power superjunction MOSFET (SJMOSFET) combined with a mixed signal device in or on epitaxial on bulk silicon. Device 202 is an embodiment of device 102 of FIG. 1.

Device 202 includes first SJMOSFET portion 204, second SJMOSFET portion 206, and surface device 208 that are all formed in or on epitaxial silicon 210 on bulk silicon 216.

First SJMOSFET portion 204 and second SJMOSFET portion 206 are electrically connected with each other. Additional SJMOSFET portions may be included to increase the power handling capacity of the SJMOSFET formed on device 202.

Epitaxial silicon 210 includes P-type silicon columns 212 formed in of N-type epitaxial layer 214. P-type silicon columns 212 and N-type epitaxial layer 214 are doped to concentrations from about 4-6 times ten to the $15^{th}$ power (mid E15) cm$^{-3}$ to about 1-3 times ten to the $16^{th}$ power (low E16) cm$^{-3}$. N+ layer 216 is a layer of bulk silicon that is in contact with metal layer 218 on a back side of the wafer.

In certain embodiments, P-type columns 212 are constructed by performing masked p-type implants into each of one or more n-type epitaxial silicon depositions disposed on an n+ bulk substrate. In certain embodiments, P-type columns 212 are constructed by etching a trench into an n-type epitaxial region disposed on an n+ bulk substrate, implanting the trench sidewalls with P-type implants, and refilling the trench with undoped epitaxial silicon or with silicon dioxide. In certain embodiments, P-type columns 212 are constructed by etching a trench into an n-type epitaxial region disposed on an n+ bulk substrate, growing a liner silicon dioxide in the trench, implanting the trench sidewalls with P-type implants, and refilling the trench with doped or undoped polysilicon.

In certain embodiments, high-voltage termination regions are not required for the SJMOSFET of device 202 due to the addition of vertically etched insulating trenches that provide sufficient electrical isolation with the trench insulating material having sufficiently low internal charge as to not disturb the charge balance of the adjacent superjunction columns. In certain embodiments, the vertically etched insulating trenches substantially bisect a P-type column width in order to maintain charge balance.

In certain embodiments, the vertically etched insulating trenches substantially bisect an N-type column width in order to maintain charge balance. For a design using epitaxial on bulk silicon technology, vertically etched insulating trenches like those present in an SOI technology are added to reduce the area consumed by the high-voltage termination regions used in epitaxial-on-bulk technology. The vertically etched insulating trenches laterally electrically isolate regions of the surface device from the regions of the power device while still relying on junction/drift isolation to provide vertical electrical isolation since there is no bottom insulator in the epitaxial-on-bulk design.

In certain embodiments, surface device 208 includes medium voltage (MV) region 220 and low voltage (LV) region 222. Surface device 208 includes four transistors as an example. Alternative embodiments can comprise only one MV region, only one LV region, or combinations thereof, and have any number or type of electrical components, such as transistors, resistors, capacitors, and so on, to form any number of digital or analog components, such as analog to digital converters, digital to analog converters, logic gates, memory, processors, state machines, EPROM, EEPROM, logic gates, and so on.

Passivation layer 224 coats the top surface of device 202 to make device 202 less affected by environmental factors. Passivation layer 224 is formed with one or more of oxide, nitride, polyimide, and so on.

Figure 2B:
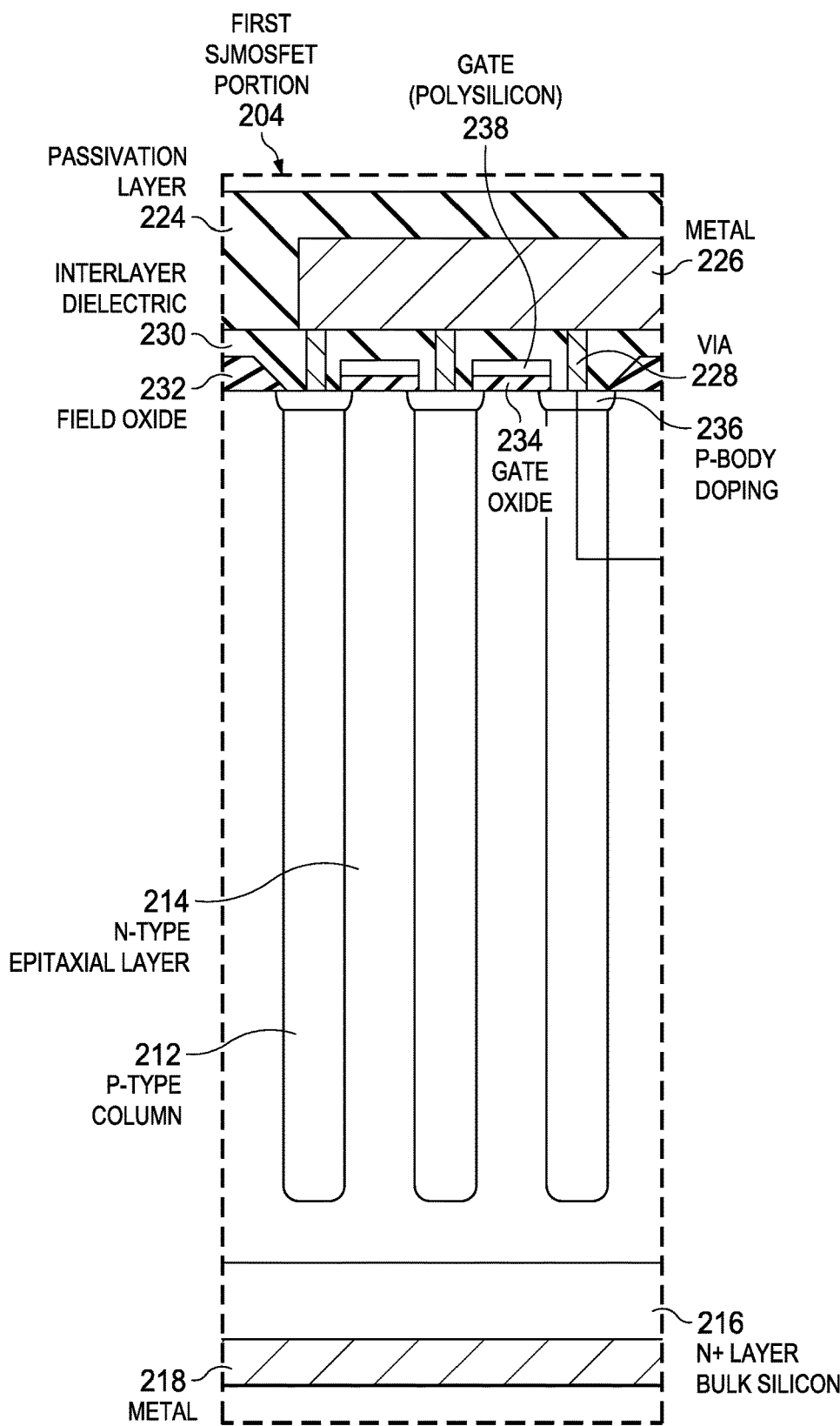
FIG. 2B is a cross sectional view of a portion of an SJMOSFET.

FIG. 2B shows the cross sections of SJMOSFET portion 204 in more detail.

Metal 226 interconnects the source of SJMOSFET portion 204 to the sources of other SJMOSFET portions, such as SJMOSFET portion 206. In alternative embodiments, a multi-level metal topology may be used. The multi-level metal topology may use Aluminum (Al) for all layers, or may use Al for the bottommost metal layers combined with Copper (Cu) for the uppermost metal layers so long as the topmost layer is thick enough (about 2-5 micrometers [μm] thick) to handle the high power requirements of the SJMOSFET of device 202. For the metal layer in MV region 220 and LV region 222, metal layer 226 may have one or more thinner lower metal layers, about 0.3-1.0 μm thick and being closest to the silicon, for dense wiring in MV region 220 and LV region 222. These thinner layers are then topped off with the thick power device metal layer as the topmost metal layer. For the SJMOSFET portions of device 202 with thinner metal layers, stacks of the lower metal layers and lower via layers would convey the current from the topmost Metal layer to the SJMOSFET within the silicon.

Via 228 is made with Tungsten (W) plugs with the contact bottom and sidewalls lined with a barrier layer, such as Titanium (Ti), Titanium Nitride (TiN), or a combination thereof.

Interlayer dielectric (ILD) 230 is a layer of dielectric material between gates 238 made of polycrystalline silicon and metal 226. Power devices, such as the SJMOSFET of device 202, typically comprise multiple SiO$_2$ (oxide) layers, with an uncharged, undoped oxide layer (non-plasma-enhanced deposition) nearest the surface, which is followed by doped (e.g., PSG (phosphosilicate glass)) and plasma-deposited oxides (e.g., PETEOS (plasma enhanced tetraethyl orthosilicate)).

Field oxide 232 is a layer field oxide for a power device that is usually thickly deposited (on the surface) oxide (i.e., not local oxidation of silicon (LOCOS)) and is wet etched to give it a slope of very close to 45° in order to maintain smoothly varying electrical fields. This is important to the power device as it transitions from a core region (where electric fields are mostly vertical) to termination regions (where electric fields are a combination of horizontal and vertical, being mostly horizontal).

Gate oxide 234 separates gate 238 from n column and p-body 236

P-body doping 236 forms the channel region of the SJMOSFET portion 204, which may also be referred to as a VDMOS (vertical diffused metal oxide semiconductor) device. P-body 236 includes N+ and P-base doping regions, which are not shown.

Gate 238 comprises polysilicon and a voltage applied to gate 238 controls an amount of current that passes between the source and drain of the SJMOSFET of device 202.

Figure 2C:
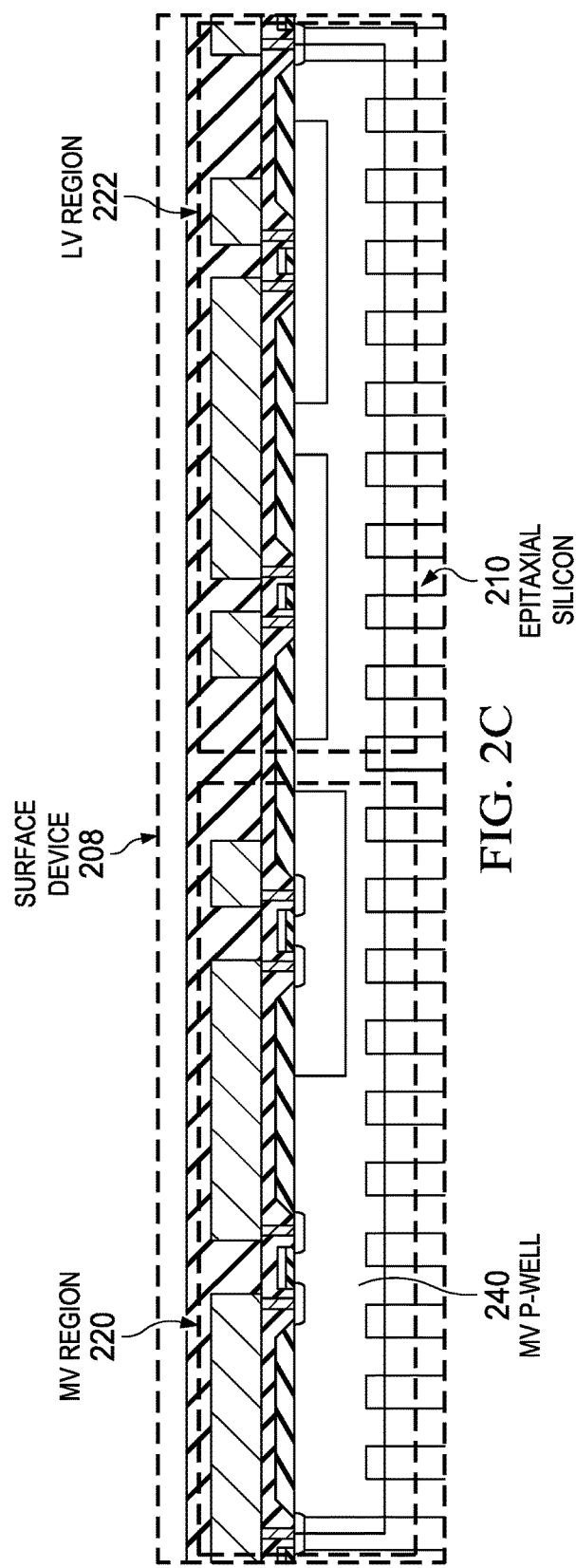
FIG. 2C is a cross sectional view of a surface device.

FIG. 2C is a cross sectional view of surface device 208. Surface device 208 includes medium voltage (MV) region 220 and low voltage (LV) region 222. Medium voltage region 220 and low voltage region 222 each comprise two exemplar MOSFET devices. In alternative embodiments, surface device 208 includes additional transistors and components to perform one or more of analog signal processing and digital signal processing. In one alternative embodiment, surface device 208 includes additional transistors to form a state machine that is used to control the on/off state of the SJMOSFET device 202. Surface device 208 includes medium voltage P-type well (MV P-well) 240 formed at the top of epitaxial silicon 210. MV P-well 240 is doped to a concentration of about low to mid E16 cm$^{-3}$, the lower bound of which is limited by the concentration of N-type epitaxial layer 214 so that the doping concentration of MV P-well 240 is greater than the background doping concentration of N-type epitaxial layer 214.

Figure 2D:
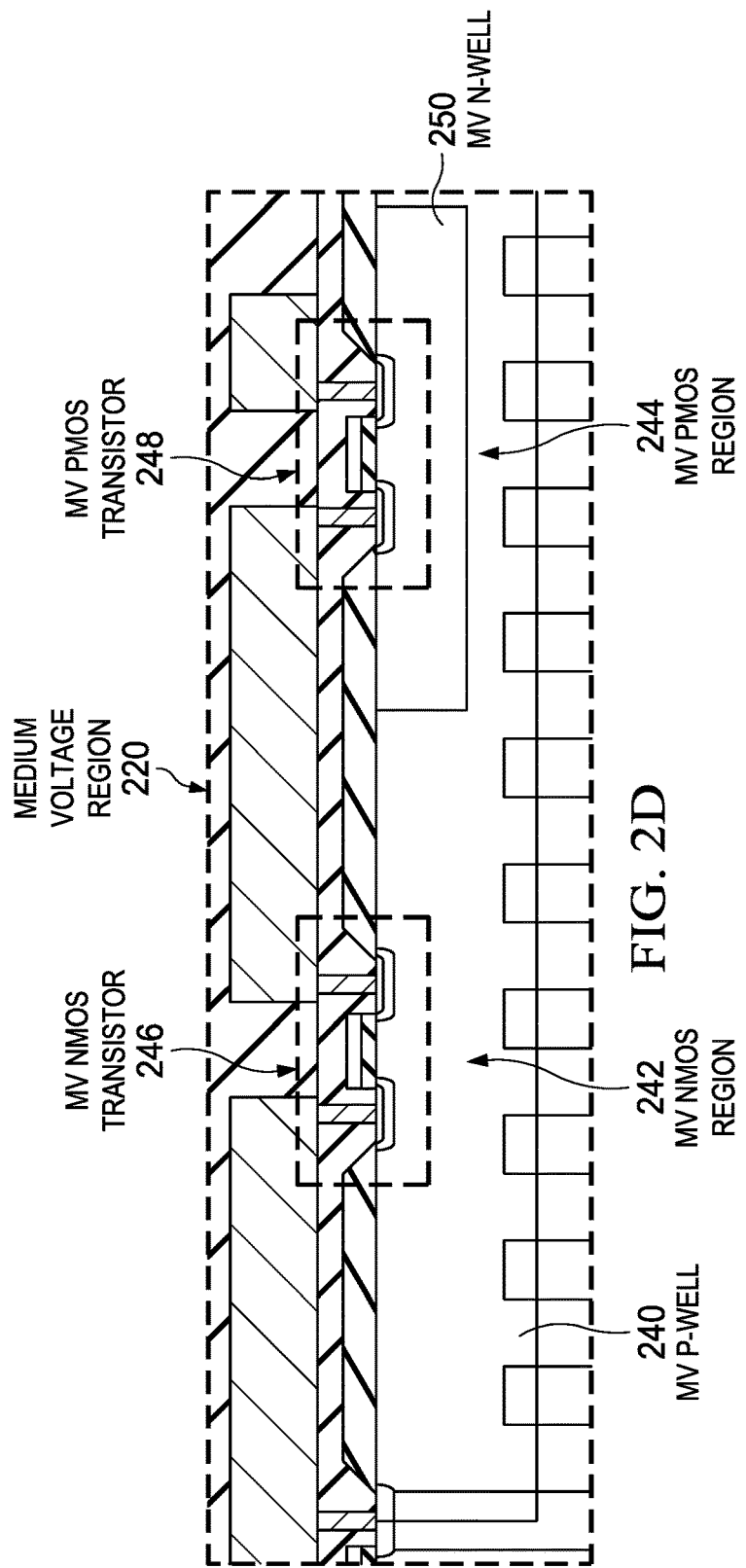
FIG. 2D is a cross sectional view of a medium voltage region of a device.

FIG. 2D is a cross sectional view of medium voltage region 220 of device 202. Medium voltage region 220 includes medium voltage N-type metal oxide semiconductor (MV NMOS) region 242 and medium voltage P-type metal oxide semiconductor (MV PMOS) region 244.

MV NMOS region 242 includes transistor 246 formed in MV P-well 240.

MV PMOS region 244 includes transistor 248 formed in MV N-well 250. MV N-well 250 is formed inside of MV P-well 240 and is doped to a concentration in mid E16 $cm^{-3}$ with the lower bound limited by the doping concentration of MV P-well 240 so that the doping concentration of MV N-well 250 is greater than the background doping concentration of MV P-well 240.

Figure 2E:
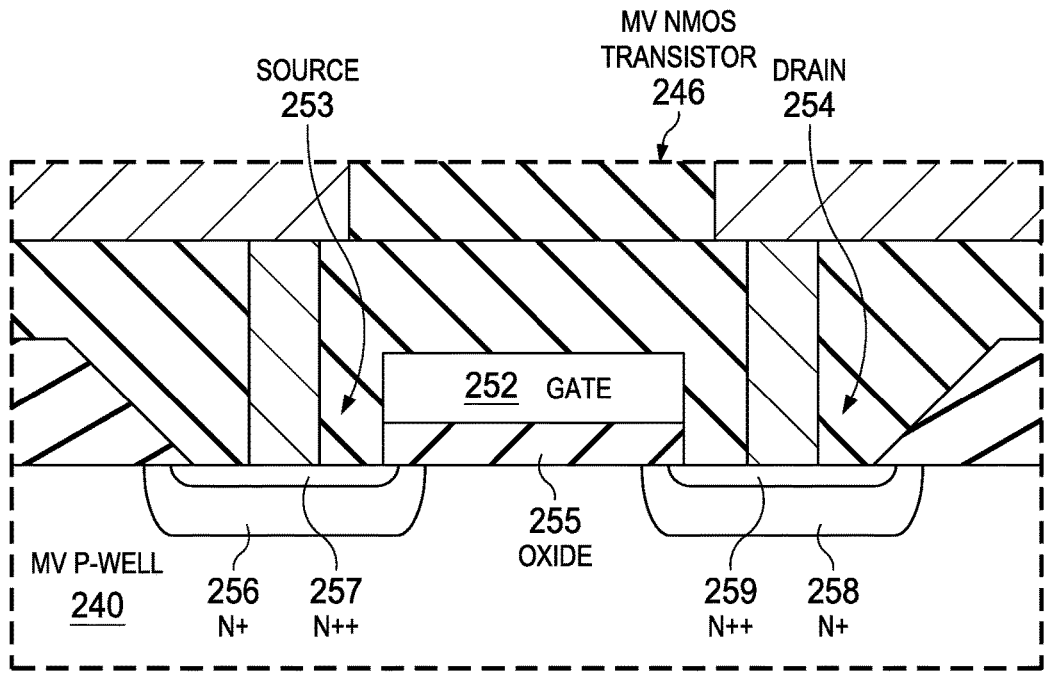
FIG. 2E is a cross sectional view of a transistor in an MV NMOS region.

FIG. 2E is a cross sectional view of transistor 246 in MV NMOS region 242. Transistor 246 includes gate 252, source 253, and drain 254. Gate 252 is made of polycrystalline silicon that controls a current between source 253 and drain 254 based on a voltage applied to gate 252. Gate oxide layer 255 separates gate 252 from epitaxial silicon 210. Source 253 comprises N+ region 256 and N++ region 257 that are formed at the top of epitaxial silicon 210 inside of MV P-well 240. Drain 254 comprises N+ region 258 and N++ region 259 that are formed at the top of epitaxial silicon 210 inside of MV P-well 240. The dose of N++ regions 257 and 259 is about 3-7 E15 $cm^{-2}$ for a concentration of about 7-9 times ten to the $19^{th}$ power (high E19) to mid E20 $cm^{-3}$. N+ regions 256 and 258 surround N++ regions 257 and 259, respectively, to grade out lateral fields and make transistor 246 capable of operating at medium voltage levels. The dose of N+ regions 256 and 258 is form high E13 to high E14 $cm^{-2}$ for a concentration from mid E17 to high E18 $cm^{-3}$.

Figure 2F:
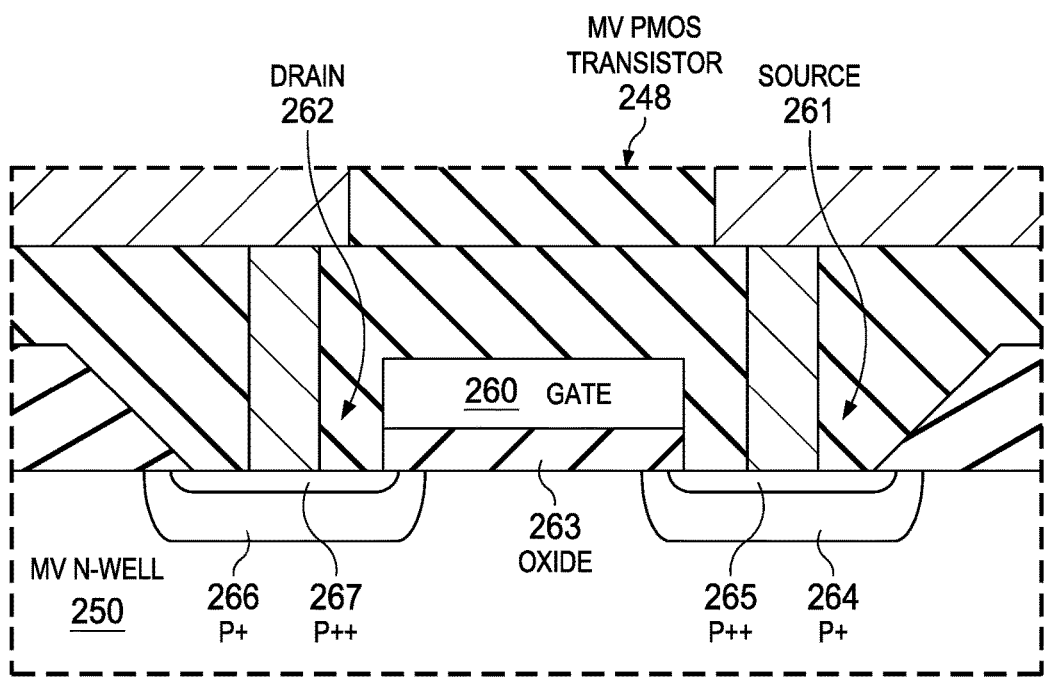
FIG. 2F is a cross sectional view of a transistor in an MV PMOS region.

FIG. 2F is a cross sectional view of transistor 248 in MV PMOS region 244. Transistor 248 includes gate 260, source 261, and drain 262. Gate 260 is made of polycrystalline silicon that controls a current between source 261 and drain 262 based on a voltage applied to gate 260. Gate oxide layer 263 separates gate 260 from epitaxial silicon 210. Source 261 comprises P+ region 264 and P++ region 265 that are formed at the top of epitaxial silicon 210 inside of MV N-well 250. Drain 262 comprises P+ region 266 and P++ region 267 that are formed at the top of epitaxial silicon 210 inside of MV N-well 250. The dose of P++ regions 265 and 267 is about 1-5 E15 $cm^{-2}$ for a concentration of in mid E19 to mid E20 $cm^{-3}$. P+ regions 264 and 266 surround P++ regions 265 and 267, respectively, to grade out lateral fields and make transistor 248 capable of operating at medium voltage levels. The dose of P+ regions 264 and 266 is form high E13 to high E14 $cm^{-2}$ for a concentration from mid E17 to high E18 $cm^{-3}$.

Figure 2G:
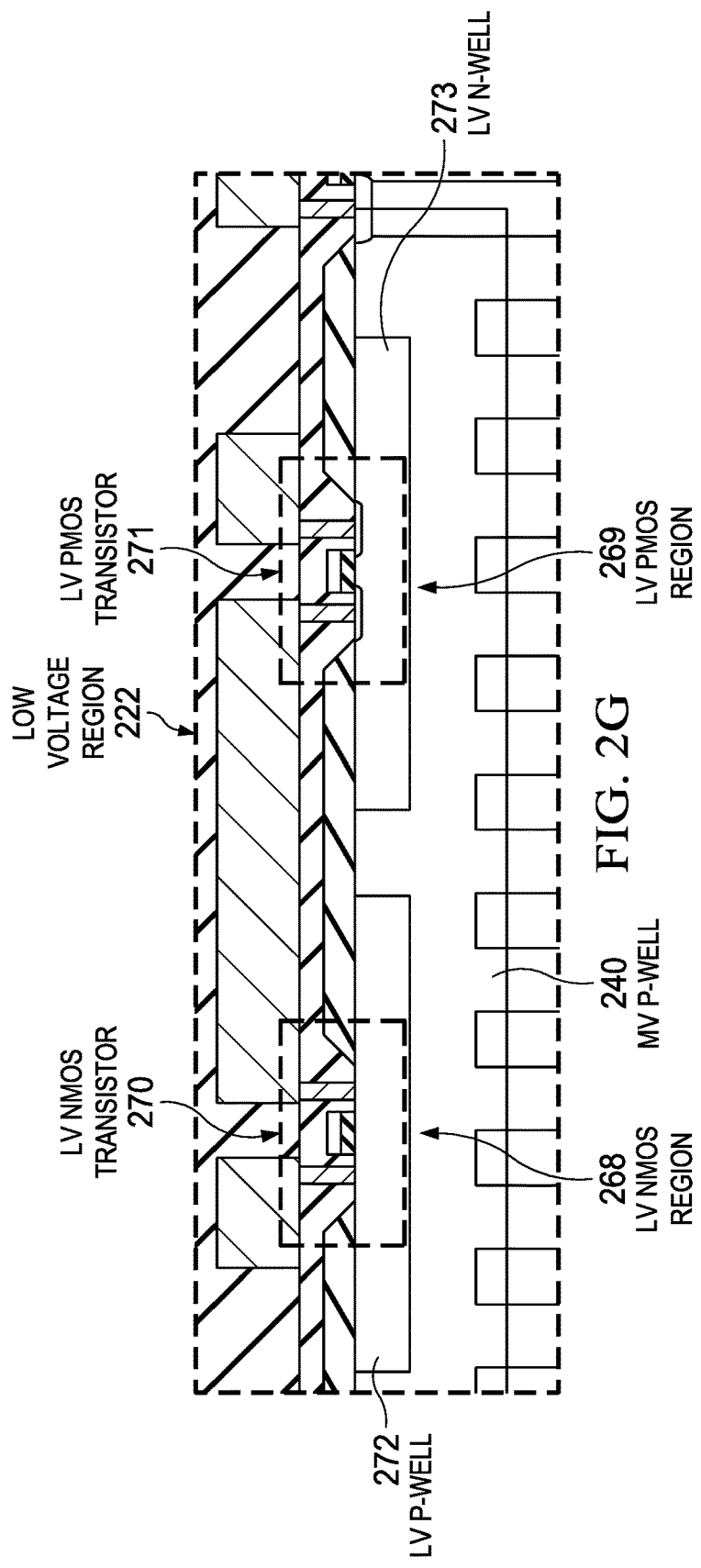
FIG. 2G is a cross sectional view of a low voltage region of a device.

FIG. 2G is a cross sectional view of low voltage region 222 of device 202. Low voltage region 222 includes low voltage N-type metal oxide semiconductor (LV NMOS) region 268 and low voltage P-type metal oxide semiconductor (LV PMOS) region 269.

LV NMOS region 268 includes transistor 270 formed in LV P-well 272. LV P-well 272 is formed inside of MV P-well 240 and has a doping concentration from about mid E16 to mid E17 $cm^{-3}$.

LV PMOS region 269 includes transistor 271 formed in LV N-well 273. LV N-well 273 is formed inside of MV P-well 240 and has a doping concentration from about high E16 to mid E17 $cm^{-3}$, the lower bound of which is limited by the doping concentration of MV P-well 240 so that the doping concentration of LV N-well 273 is greater than the background doping concentration of MV P-well 240.

Figure 2H:
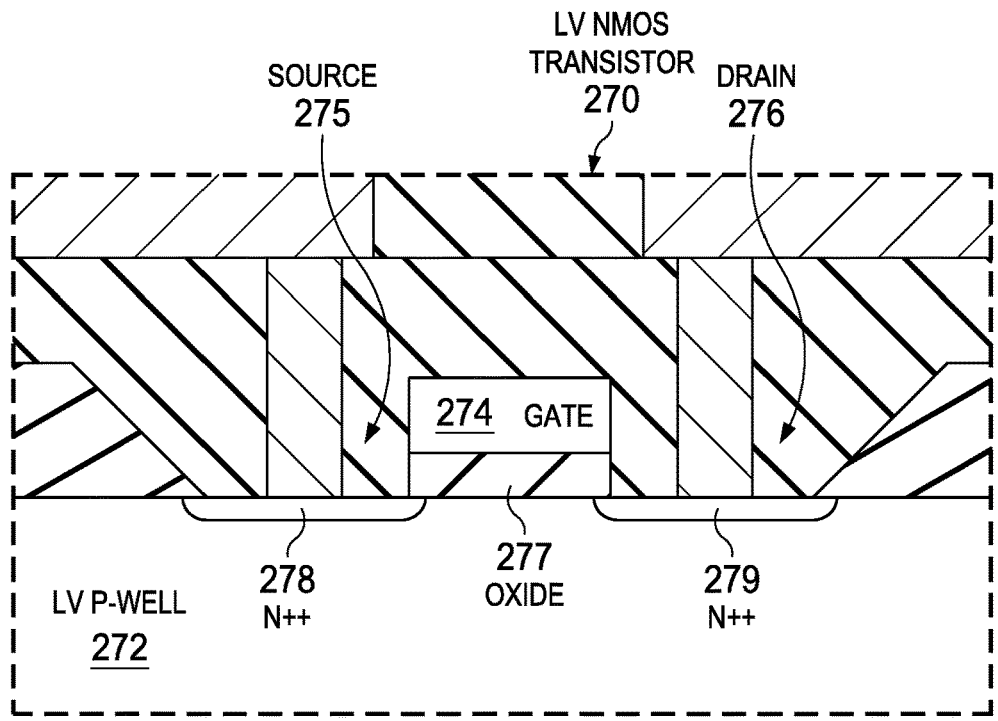
FIG. 2H is a cross sectional view of a transistor in an LV NMOS region.

FIG. 2H is a cross sectional view of transistor 270 in LV NMOS region 268. Transistor 270 includes gate 274, source 275, and drain 276. Gate 274 is made of polycrystalline silicon that controls a current between source 275 and drain 276 based on a voltage applied to gate 274. Gate oxide layer 277 separates gate 274 from epitaxial silicon 210. Source 275 comprises N++ region 278 that is formed at the top of epitaxial silicon 210 inside of LV P-well 272, which is formed inside of MV P-well 240. Drain 276 comprises N++ region 279 that is formed at the top of epitaxial silicon 210 inside of LV P-well 272. The doses of N++ regions 278 and 279 are about 3-7 E15 $cm^{-2}$ for a concentration from high E19 to mid E20 $cm^{-3}$.

Figure 2I:
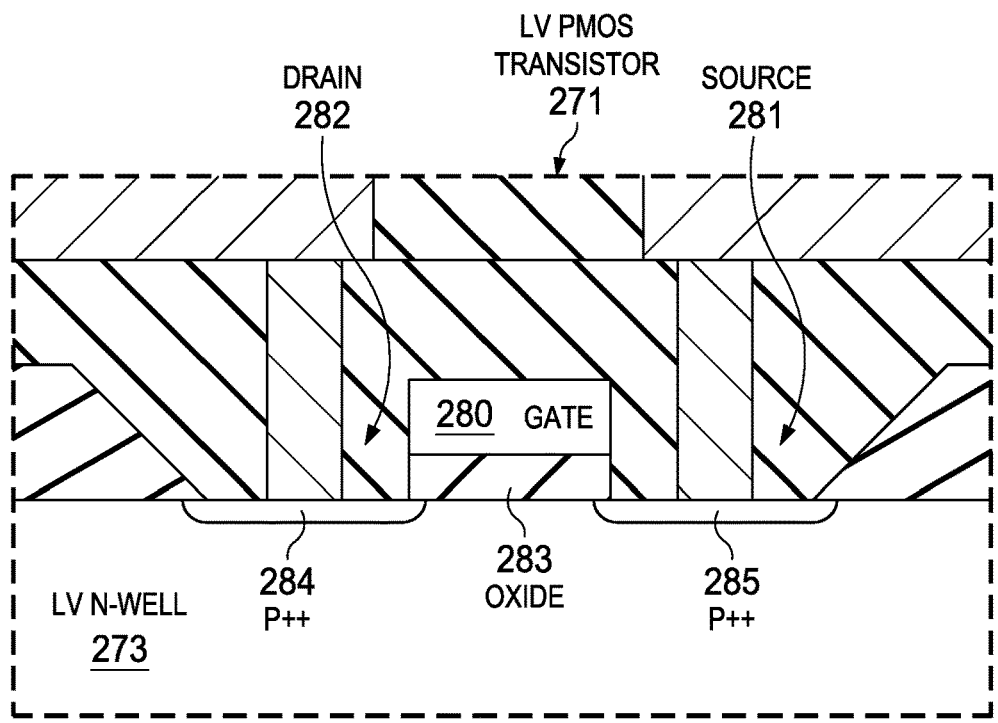
FIG. 2I is a cross sectional view of a transistor in an LV PMOS region.

FIG. 2I is a cross sectional view of transistor 271 in LV PMOS region 269. Transistor 271 includes gate 280, source 281, and drain 282. Gate 280 is made of polycrystalline silicon that controls a current between source 281 and drain 282 based on a voltage applied to gate 280. Gate oxide layer 283 separates gate 280 from epitaxial silicon 210. Source 281 comprises P++ region 285 that is formed at the top of epitaxial silicon 210 inside of LV N-well 273. Drain 282 comprises P++ region 284 that is formed at the top of epitaxial silicon 210 inside of LV N-well 273. The doses of P++ regions 284 and 285 are about 1-5 E15 $cm^{-2}$ for a concentration of mid E19 to mid E20 $cm^{-3}$.

Figure 2J:
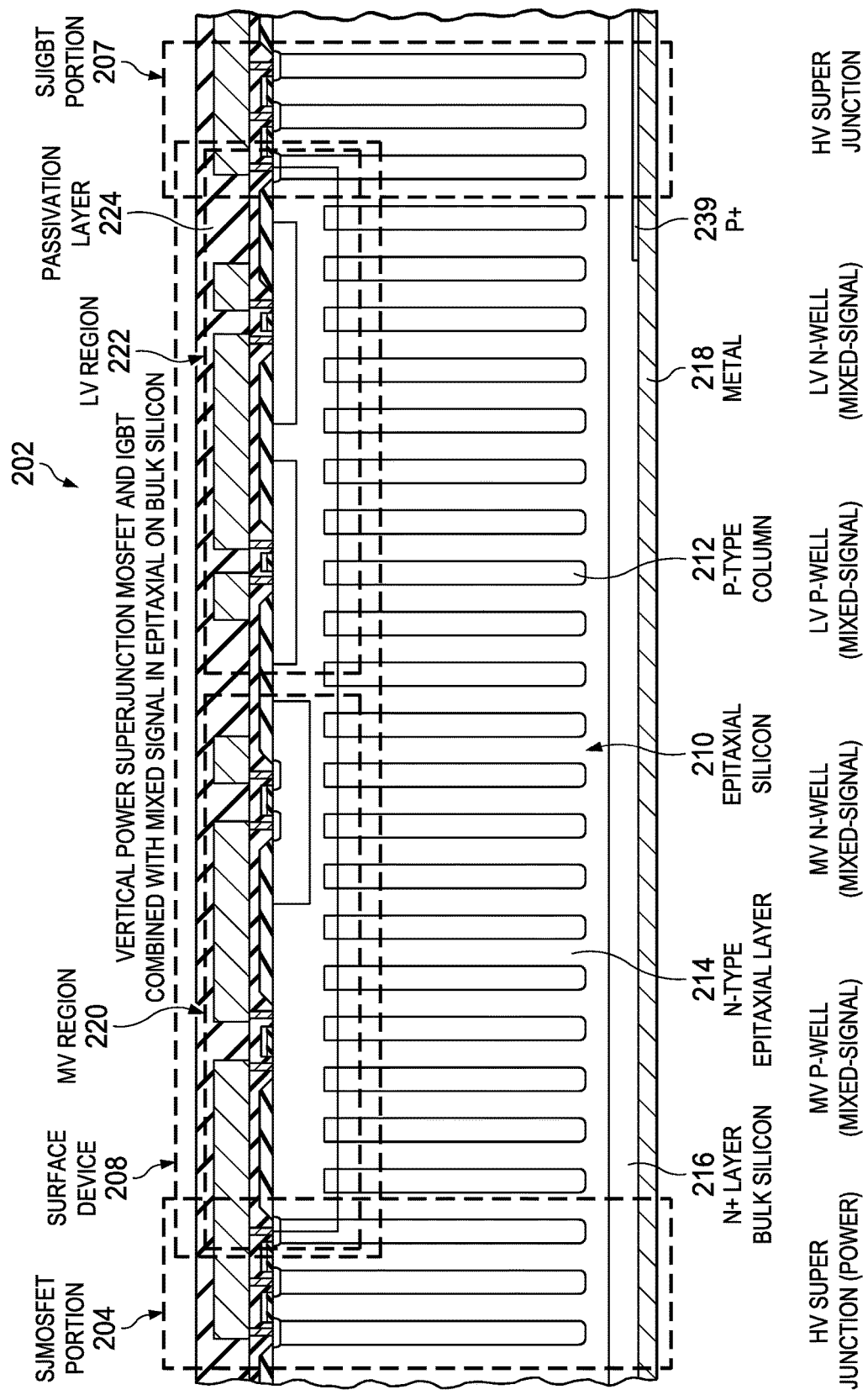
FIG. 2J is a cross section view of a semiconductor device comprising a vertical power superjunction MOSFET (SJ-MOSFET) and IGBT combined with a mixed signal device in epitaxial on bulk silicon in accordance with the disclosure.

FIG. 2J is a cross sectional view of a device with a vertical power device that includes superjunction IGBT (SJIGBT) portion 207 that is in parallel with SJMOSFET portion 204. Providing an SJIGBT in parallel with an SJMOSFET forms a composite superjunction IGBT and MOSFET high-voltage device. The gate busses for SJIGBT portion 207 and SJMOSFET portion 204 can be separated in order to individually control the ON-OFF timing of SJIGBT portion 207 and SJMOSFET portion 204. Optimization of the relative ON-OFF timing of SJIGBT portion 207 and SJMOSFET portion 204 results in a composite device with the superior switching speed of a MOSFET combined with the superior current-handling capability of an IGBT. In certain embodiments, the embedded mixed signal circuitry controls the relative ON-OFF timing of SJIGBT portion 207 and SJMOSFET portion 204 to optimize switching speed and current-handling capability of the composite device.

Figure 3A:
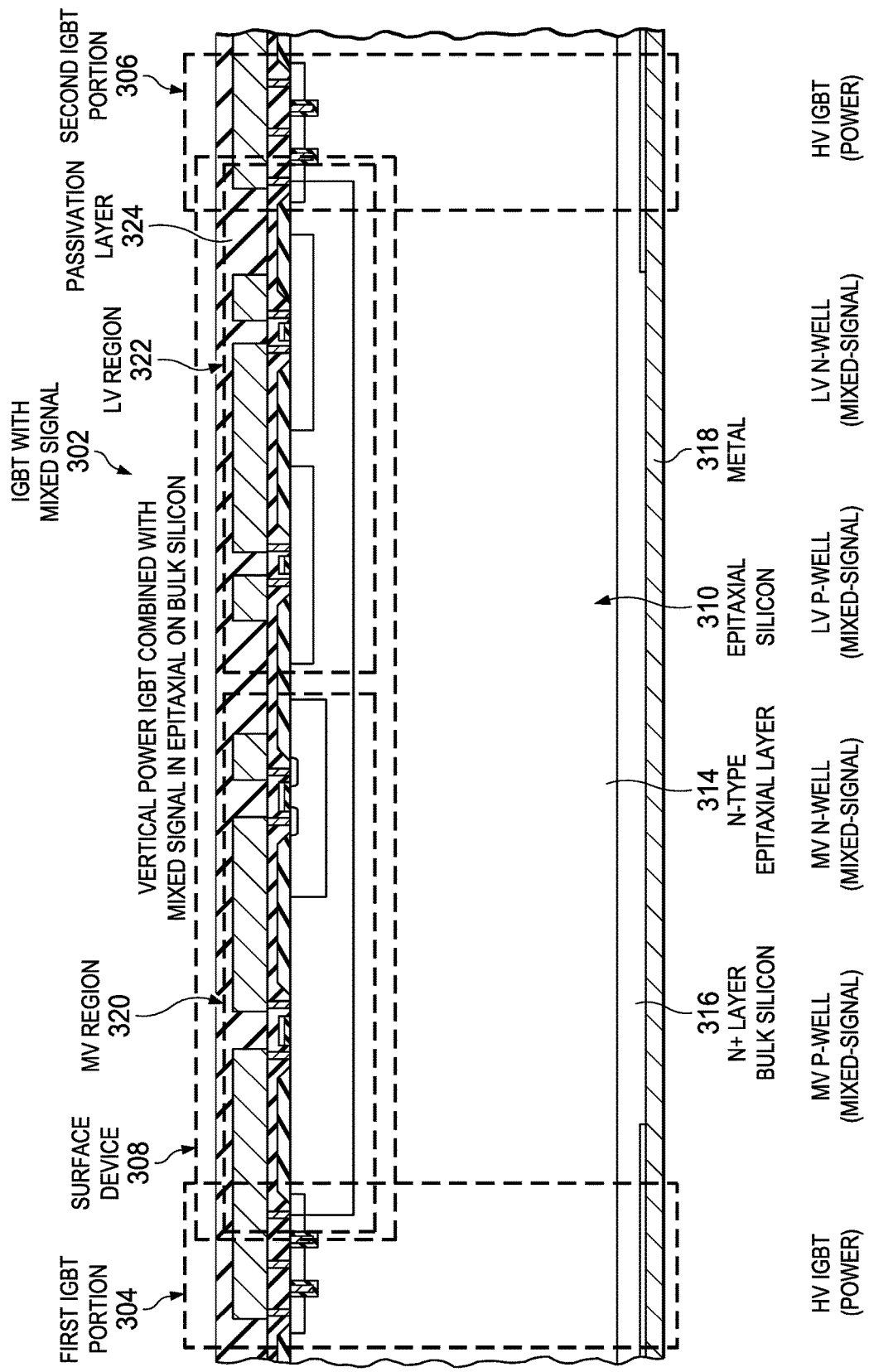
FIG. 3A is a cross section view of a semiconductor device comprising a vertical IGBT combined with a mixed signal device in epitaxial on bulk silicon in accordance with the disclosure.

Referring to FIG. 3A, shown is a cross section view of semiconductor device 302 comprising a vertical IGBT combined with a mixed signal device in epitaxial on bulk silicon. Device 302 is an embodiment of device 102 of FIG. 1.

First IGBT portion 304 and second IGBT portion 306 are electrically connected with each other. Additional IGBT portions may be included to increase the power handling capacity of the IGBT formed on device 302.

Epitaxial silicon 310 includes N-type epitaxial layer 314, which is doped to concentrations from about 4-6 times ten to the $15^{th}$ power (mid E15) $cm^{-3}$ to about 1-3 times ten to the $16^{th}$ power (low E16) $cm^{-3}$. Bulk silicon N+ layer 316 and metal layer 318 are formed on a back side of the wafer.

Surface device 308 includes medium voltage (MV) region 320 and low voltage (LV) region 322. Surface device 308 includes four transistors. Alternative embodiments can comprise only one MV region, only one LV region or combinations thereof, and have any number or type of electrical components, such as transistors, resistors, capacitors, and so on, to form any number of digital or analog components, such as analog to digital converters, digital to analog converters, logic gates, memory, processors, state machines, and so on.

Passivation layer 324 coats the top surface of device 302 to make device 302 less affected by environmental factors. Passivation layer 324 is formed with one or more of oxide, nitride, polyimide, and so on.

Figure 3B:
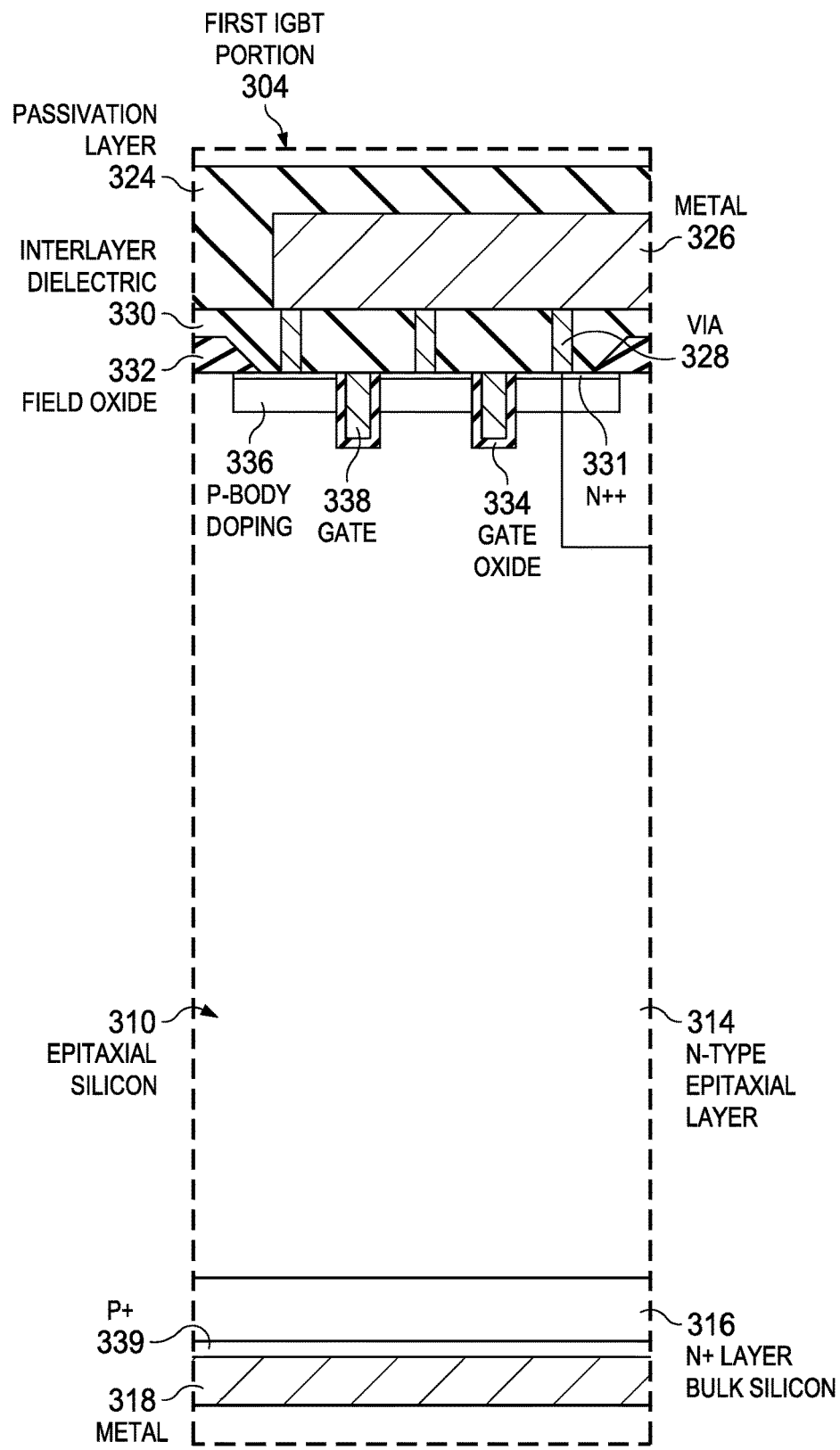
FIG. 3B shows a cross sectional view of a portion of an IGBT in more detail.

FIG. 3B shows the cross section of IGBT portion 304 in more detail.

Metal 326 interconnects the emitter of IGBT portion 304 to the emitters of other IGBT portions, such as IGBT portion 306. In alternative embodiments, a multi-level metal topology may be used. The multi-level metal topology may use Aluminum (Al) for all layers, or may use Al for the bottommost metal layers combined with Copper (Cu) for the uppermost metal layers so long as the topmost layer is thick enough (about 2-5 micrometers [µm] thick) to handle the high power requirements of the IGBT of device 302. The source of MV NMOS transistor 346 in MV region 320 is connected to the emitter of the IGBT of device 302 by metal 326.

Via 328 is made with Tungsten (W) plugs with the contact bottom and sidewalls lined with a barrier layer, such as Titanium (Ti), Titanium Nitride (TiN), or a combination thereof.

Interlayer dielectric (ILD) 330 is a layer of dielectric material between the gates made of polycrystalline silicon and metal 326. Power devices, such as the IGBT of device 302, typically comprise multiple $SiO_2$ (oxide) layers, with an uncharged, undoped oxide layer (non-plasma-enhanced deposition) nearest the surface, which is followed by doped (e.g., PSG) and plasma-deposited oxides (e.g., PETEOS).

Field oxide 332 is a layer field oxide for a power device that is thick deposited (on the surface) oxide (i.e., not local oxidation of silicon (LOCOS)) and is wet etched to give it a slope of very close to 45° in order to maintain smoothly varying electrical fields. This is important to the power device as it transitions from a core region (where electric fields are mostly vertical) to termination regions (where electric fields are a combination of horizontal and vertical, being mostly horizontal).

Gate oxide 334 separates gate 338 from N-type epitaxial layer 314 in epitaxial silicon 310 of a wafer.

P-body doping 336, with doping in the range of low E16 $cm^{-3}$ to low E18 $cm^{-3}$, is formed towards a top surface of epitaxial silicon 310 in IGBT portion 306. N++ layer 331 is formed within P-body 336.

Gate 338 comprises polysilicon and a voltage applied to gate 338 controls an amount of current that passes between the emitter and collector of the IGBT of device 302. For clarity in the drawings, the gate contact and control is not shown.

P+ layer 339 forms a P-N junction with N+ layer 316 to form the collector of first IGBT portion 304.

Figure 3C:
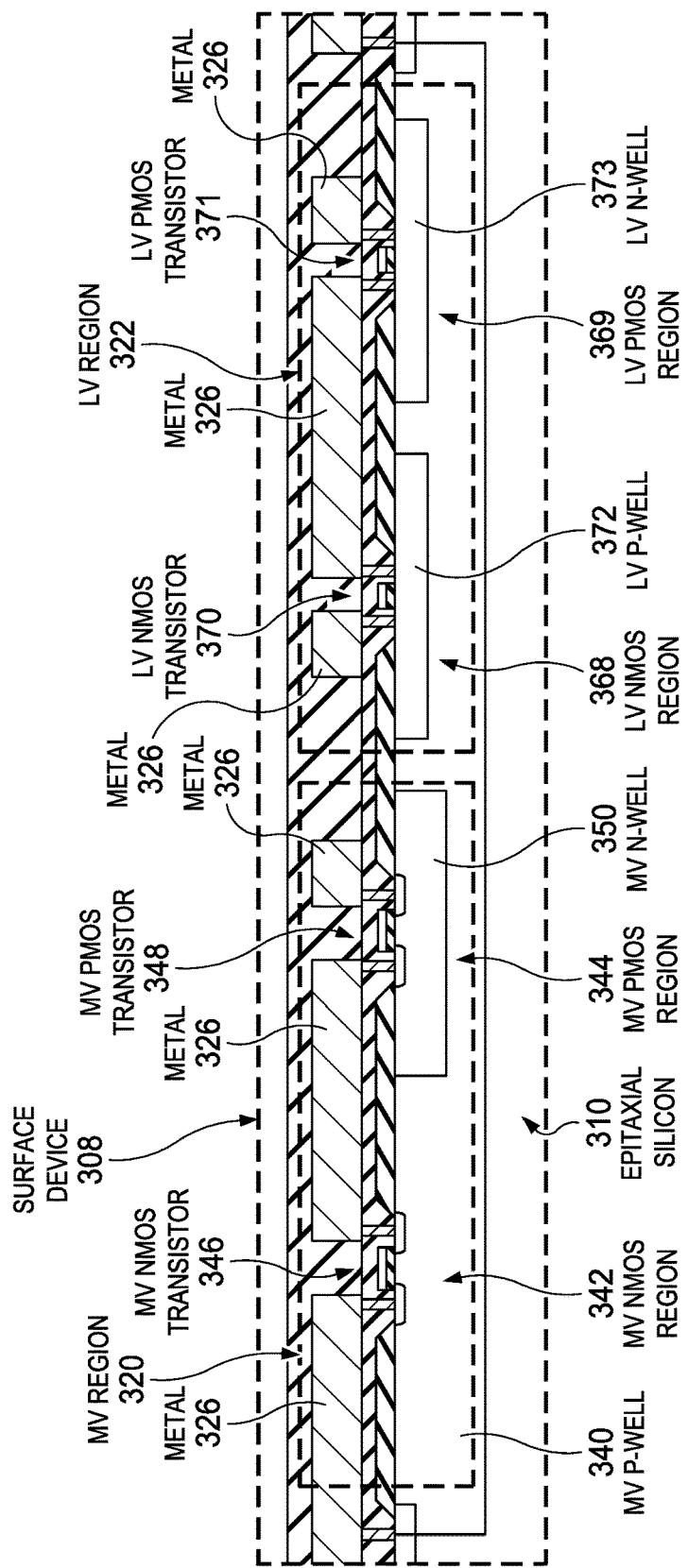
FIG. 3C is a cross sectional view of a surface device.

FIG. 3C is a cross sectional view of surface device 308. Surface device 308 includes medium voltage (MV) region 320 and low voltage (LV) region 322. Medium voltage region 320 and low voltage region 322 each comprise two exemplar MOSFET devices. In alternative embodiments, surface device 308 includes additional transistors and components to perform one or more of analog signal processing and digital signal processing. In one alternative embodiment, surface device 308 includes additional transistors to form a state machine that is used to control the on/off state of the IGBT of device 302. Surface device 308 includes medium voltage P-type well (MV P-well) 340 formed at the top of epitaxial silicon 310. MV P-well 340 is doped to a concentration of about low to mid E16 $cm^{-3}$, the lower bound of which is limited by the concentration of N-type epitaxial layer 314 so that the doping concentration of MV P-well 340 is greater than the background doping concentration of N-type epitaxial layer 314.

Metal 326 is formed as a single discontinuous layer on top of ILD 330. In alternative embodiments, the metal layer in MV region 320 and LV region 322, metal layer 326 may have one or more "thin" lower metal layers, about 0.3-1.0 µm thick and being closest to the silicon, for dense wiring in MV region 320 and LV region 322. These thin layers are then topped off with the thick power device metal layer as the topmost metal layer. For the IGBT portions of device 302 with thin metal layers, stacks of the lower metal layers and lower via layers would convey the current from the topmost Metal layer to the IGBT within the silicon.

Medium voltage region 320 includes medium voltage N-type metal oxide semiconductor (MV NMOS) region 342 and medium voltage P-type metal oxide semiconductor (MV PMOS) region 344. MV NMOS region 342 includes transistor 346 formed in MV P-well 340. MV PMOS region 344 includes transistor 348 formed in MV N-well 350.

MV N-well 350 is formed inside of MV P-well 340 and is doped to a concentration in mid E16 $cm^{-3}$ with the lower bound limited by the doping concentration of MV P-well 340 so that the doping concentration of MV N-well 350 is greater than the background doping concentration of MV P-well 340.

Transistor 346 in MV NMOS region 342 and transistor 348 in MV PMOS region 344 are similar in form and function as that of transistor 246 of FIG. 2E and transistor 248 of FIG. 2F, respectively.

Low voltage region 322 includes low voltage N-type metal oxide semiconductor (LV NMOS) region 368 and low voltage P-type metal oxide semiconductor (LV PMOS) region 369. LV NMOS region 368 includes transistor 370 formed in LV P-well 372. LV P-well 372 is formed inside of MV P-well 340 and has a doping concentration from about mid E16 to mid E17 $cm^{-3}$.

LV PMOS region 369 includes transistor 371 formed in LV N-well 373. LV N-well 373 is formed inside of MV P-well 340 and has a doping concentration from about high E16 to mid E17 $cm^{-3}$, the lower bound of which is limited by the doping concentration of MV P-well 340 so that the doping concentration of LV N-well 373 is greater than the background doping concentration of MV P-well 340.

Transistor 370 in LV NMOS region 368 and transistor 371 in LV PMOS region 369 are similar in form and function as that of transistor 270 of FIG. 2H and transistor 271 of FIG. 2I, respectively.

Figure 4A:
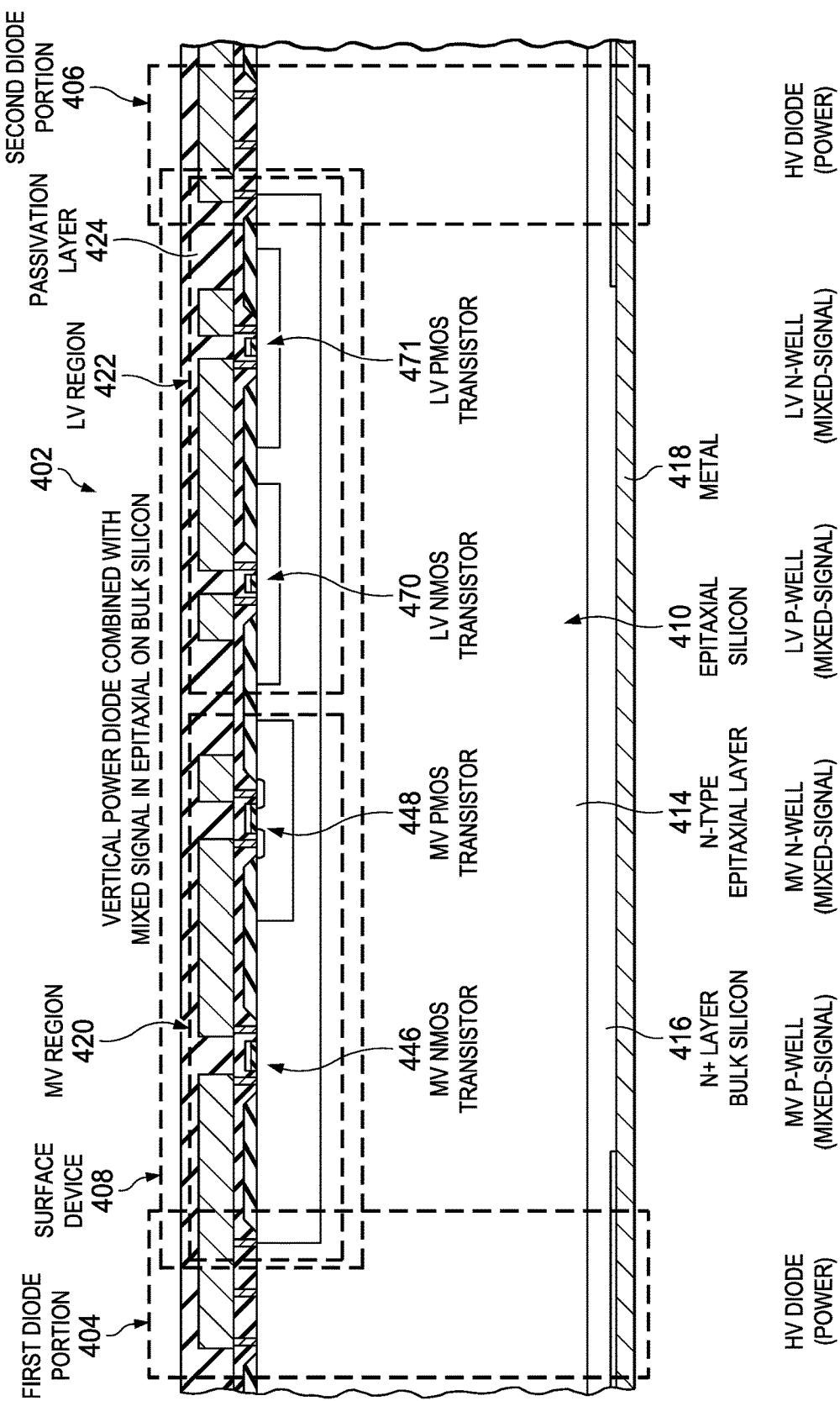
FIG. 4A is a cross section view of a semiconductor device comprising a vertical power diode combined with a mixed signal device in epitaxial on bulk silicon in accordance with the disclosure.

With reference to FIG. 4A, a cross section view is shown of semiconductor device 402 comprising a vertical power diode combined with a mixed signal device in or on epitaxial on bulk silicon. Device 402 is an embodiment of device 102 of FIG. 1.

First diode portion 404 and second diode portion 406 are electrically connected with each other. Additional diode portions may be included to increase the power handling capacity of the diode formed on device 402.

Epitaxial silicon 410 includes N-type epitaxial layer 414, which is doped to concentrations from about 4-6 times ten to the $15^{th}$ power (mid E15) $cm^{-3}$ to about 1-3 times ten to the $16^{th}$ power (low E16) $cm^{-3}$. N+ layer 416 is a layer of bulk silicon that is in contact with metal layer 418 on a back side of the wafer.

Surface device 408 includes medium voltage (MV) region 420 and low voltage (LV) region 422. Surface device 408 includes four transistors. Alternative embodiments can comprise only one MV region, only one LV region, or combinations thereof, and have any number or type of electrical components, such as transistors, resistors, capacitors, and so on, to form any number of digital or analog components, such as analog to digital converters, digital to analog converters, logic gates, memory, processors, state machines, and so on.

Passivation layer 424 coats the top surface of device 402 to make device 402 less affected by environmental factors. Passivation layer 424 is formed with one or more of oxide, nitride, polyimide, and so on.

MV region 420 includes MV NMOS transistor 446 and MV PMOS transistor 448. MV region 420 and its respective transistors are similar in form and function as that of MV region 220 of FIG. 2C and MV region 320 of FIG. 3C.

LV region 422 includes LV NMOS transistor 470 and LV PMOS transistor 471. LV region 422 and its respective transistors are similar in form and function as that of LV region 222 of FIG. 2C and LV region 322 of FIG. 3C.

Figure 4B:
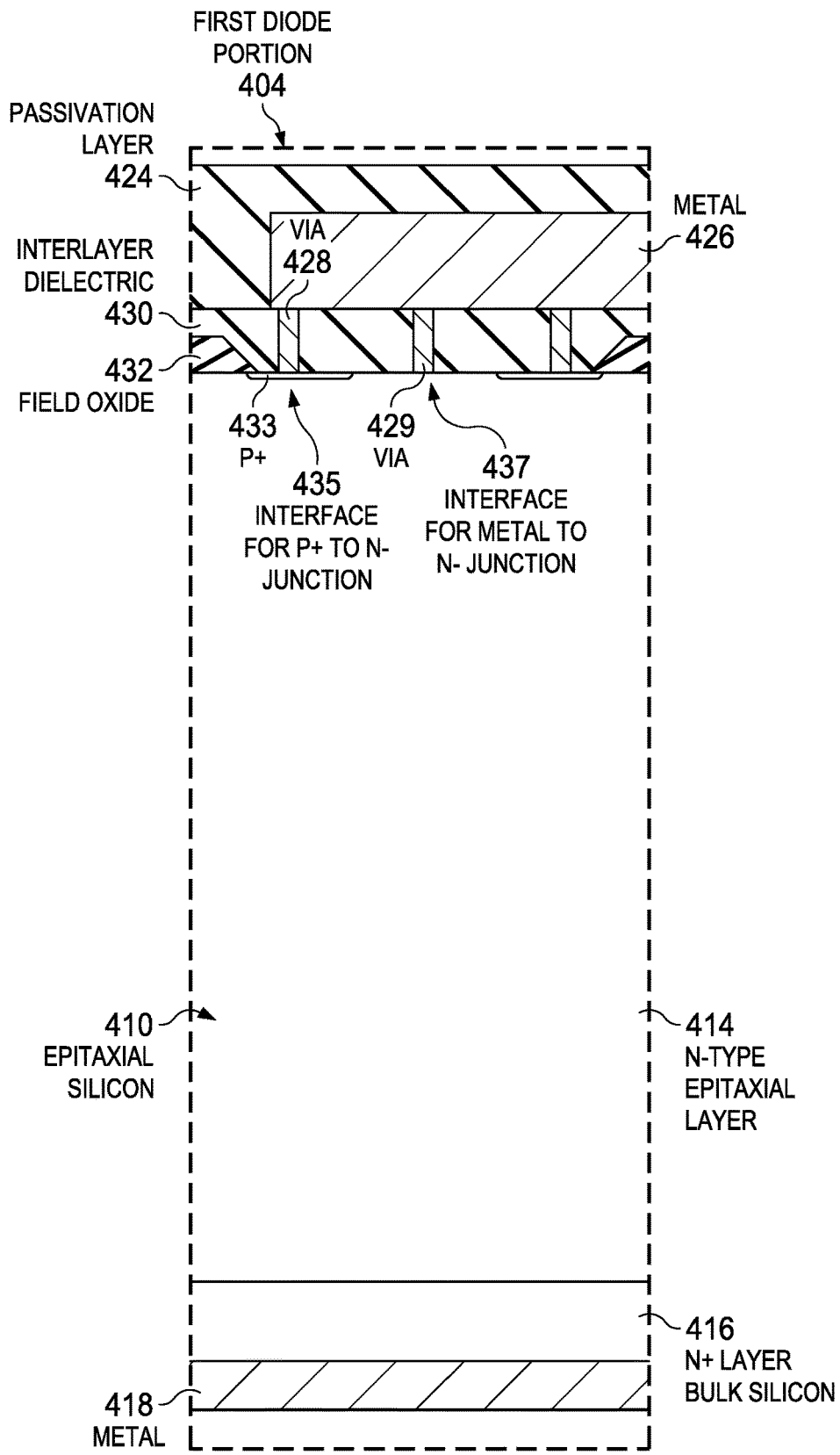
FIG. 4B shows the cross sectional view of a portion of a diode in more detail.

FIG. 4B shows the cross section of diode portion 404 in more detail.

Metal 426 interconnects the anode of diode portion 404 to the anodes of other diode portions, such as diode portion 406. In alternative embodiments, Aluminum (Al) or Copper (Cu) is used in a multi-level metal topology with a thick layer of Al to handle the high power requirements of the diode of device 402. In a multi-level metal topology, all Al is used or Al us used near silicon that becomes Cu in upper layers. The topmost layer of metal is thick (about 2-5 micrometers (μm) thick) to carry the current for device 402. The source of MV NMOS transistor 446 in MV region 420 is connected to the emitter of the diode of device 402 by metal 426.

Via 428 is made with Tungsten (W) plugs with the contact bottom and sidewalls lined with a barrier layer, such as Titanium (Ti), Titanium Nitride (TiN), or a combination thereof.

Interlayer dielectric (ILD) 430 is a layer of dielectric material that separates metal 426 from the electrically active portions of device 402. Power devices, such as the diode of device 402, typically comprise multiple $SiO_2$ (oxide) layers, with an uncharged, undoped oxide layer (non-plasma-enhanced deposition) nearest the surface, which is followed by doped (e.g., PSG) and plasma-deposited oxides (e.g., PETEOS).

Field oxide 432 is a layer field oxide for a power device that is thick deposited (on the surface) oxide (i.e., not local oxidation of silicon (LOCOS)) and is wet etched to give it a slope of very close to 45° in order to maintain smoothly varying electrical fields. This is important to the power device as it transitions from a core region (where electric fields are mostly vertical) to termination regions (where electric fields are a combination of horizontal and vertical, being mostly horizontal).

P+ layer 433, with doping in the range of high E18 $cm^{-3}$ to low E20 $cm^{-3}$, is formed towards a top surface of epitaxial silicon 410 in diode portion 404 and is connected to metal 426 by via 428. Interface 435 is the interface between P+ layer 433 and the N− doped epitaxial layer 414 forms a P-N junction to create a silicon junction diode. Interface 437 is the interface between via 429 and the N− doped N-type epitaxial layer 414 that forms a metal-semiconductor junction to create a Schottky barrier for a Schottky diode. In additional embodiments, the diode of device 402 comprises only silicon junction diodes, comprises only Schottky diodes, or any combination of silicon junction diodes and Schottky diodes.

Figure 5:
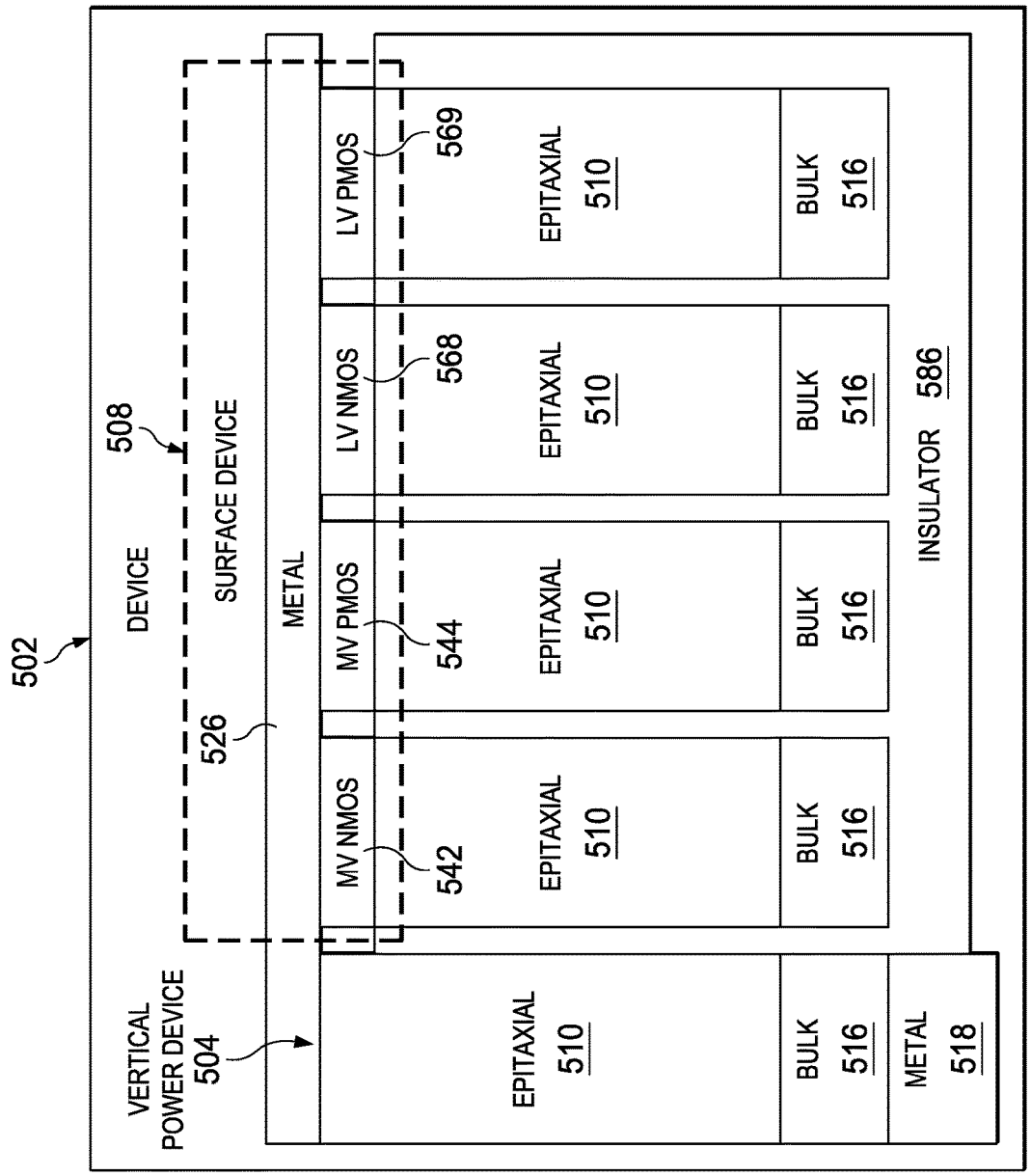
FIG. 5 is a block diagram of a semiconductor device that includes a vertical power device and a mixed signal surface device formed using silicon-on-insulator (SOI) technology in accordance with the disclosure.

FIG. 5 is a block diagram of semiconductor device 502 that includes vertical power device 504 and mixed signal surface device 508 formed using silicon-on-insulator (SOI) technology. In one embodiment, vertical power device 504 is controlled by surface device 508. Vertical power device 504 and surface device 508 are formed on epitaxial silicon 510 and are separated by insulator 586.

Vertical power device 504 comprises one or more power devices, subsets of which are connected together in parallel to form one or more power devices, such as an SJMOSFET, an IGBT, a silicon junction diode, a Schottky diode, and so on. Vertical power device 504 is connected between metal 526 and metal 518, which may each include one or more layers of metal. Power flows through vertical power device 504 between metal 526 on the top surface or front-side of a wafer and metal 518 on the bottom surface or back-side of the wafer.

Surface device 508 is a mixed signal device that comprises one or more of an analog circuit and a digital circuit. Surface device 508 includes one or more MOS regions, such as MV NMOS region 542, MV PMOS region 544, LV NMOS region 568, and LV PMOS region 569. Each region comprises one or more circuits comprising one or more transistors and the different circuits are interconnected by metal 526. Alternative embodiments can have any number or type of electrical components formed in surface device 508, such as transistors, resistors, capacitors, and so on, to form any number of digital or analog components, such as analog to digital converters, digital to analog converters, logic gates, memory, processors, state machines, EPROM, EEPROM, logic gates, and so on.

MV NMOS region 542 and MV PMOS region 544 operate at a medium voltage level while LV NMOS region 568 and LV PMOS region 569 operate at a low voltage level. Each of the regions is optionally separated from each other by insulator 586.

Since portions of epitaxial silicon 510 are not carrying current below surface device 508, this portion of epitaxial silicon 510 will have a lower temperature than epitaxial silicon 510 that forms vertical power device 504. In certain embodiments, the regions of surface device 508 are strategically placed or interspersed around or within the vertical device areas so as to dissipate the heat from vertical power device 504 and lower the overall temperature of device 502.

Figure 6A:
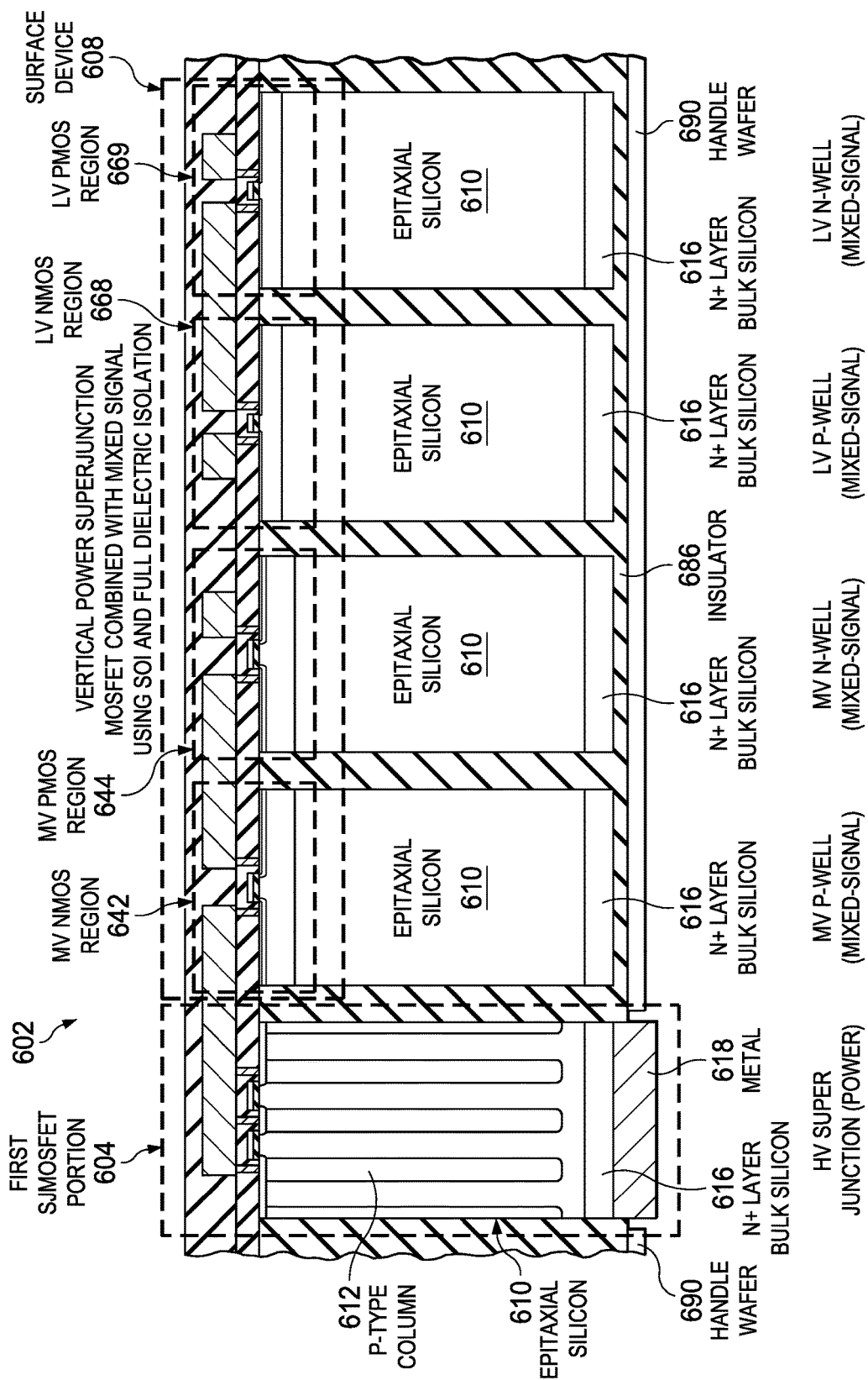
FIG. 6A is a cross sectional view of a device that comprises a vertical SJMOSFET and a surface device, which are formed in epitaxial on bulk silicon and are separated by an insulator using silicon-on-insulator technology.

FIG. 6A is a cross sectional view of device 602 that comprises a vertical SJMOSFET and surface device 608, which are formed on epitaxial silicon 610 on bulk silicon 616 and are separated by insulator 686. Device 602 is an embodiment of device 502 of FIG. 5. Handle wafer 690 supports device 602 during handling and processing. First SJMOSFET portion 604 includes P-type columns 612 formed in epitaxial silicon 610. Surface device 608 comprises MV NMOS region 642, MV PMOS region 644, LV NMOS region 668, and LV PMOS region 669, which are each separated by insulator 686. MV NMOS region 642, MV PMOS region 644, LV NMOS region 668, and LV PMOS region 669 do not include P-type columns within the epitaxial silicon 610. MV NMOS region 642, MV PMOS region 644, LV NMOS region 668, and LV PMOS region 669 each include a single well with a semiconductor doping type and concentration needed for the types of devices embodied in each respective region.

Figure 6B:
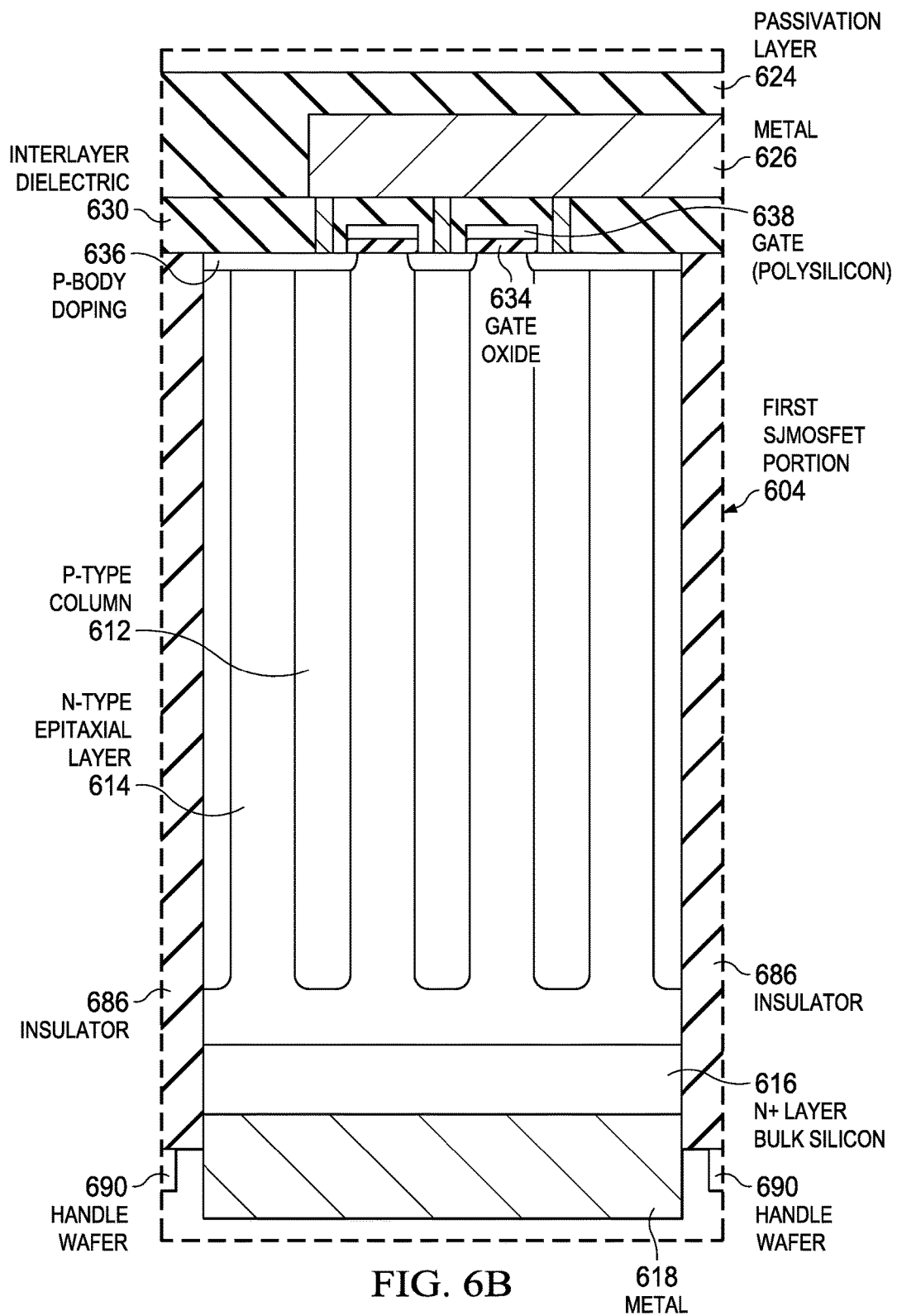
FIG. 6B is a cross sectional view of a portion of an SJMOSFET.

FIG. 6B is a cross sectional view of first SJMOSFET portion 604. First SJMOSFET portion 604 includes passivation layer 624, metal 626, ILD 630, gate 638, P-body doping 636, gate oxide 634, P-type column 612, N-type epitaxial layer 614, N+ layer 616, metal 618, and is surrounded by insulator 686. The form and function of First SJMOSFET portion 604 is similar to that of first SJMOSFET portion 204 of FIGS. 2A and 2B. Insulator 686 isolates and insulates first SJMOSFET portion 604 from other circuitry that is part of device 602.

Figure 6C:
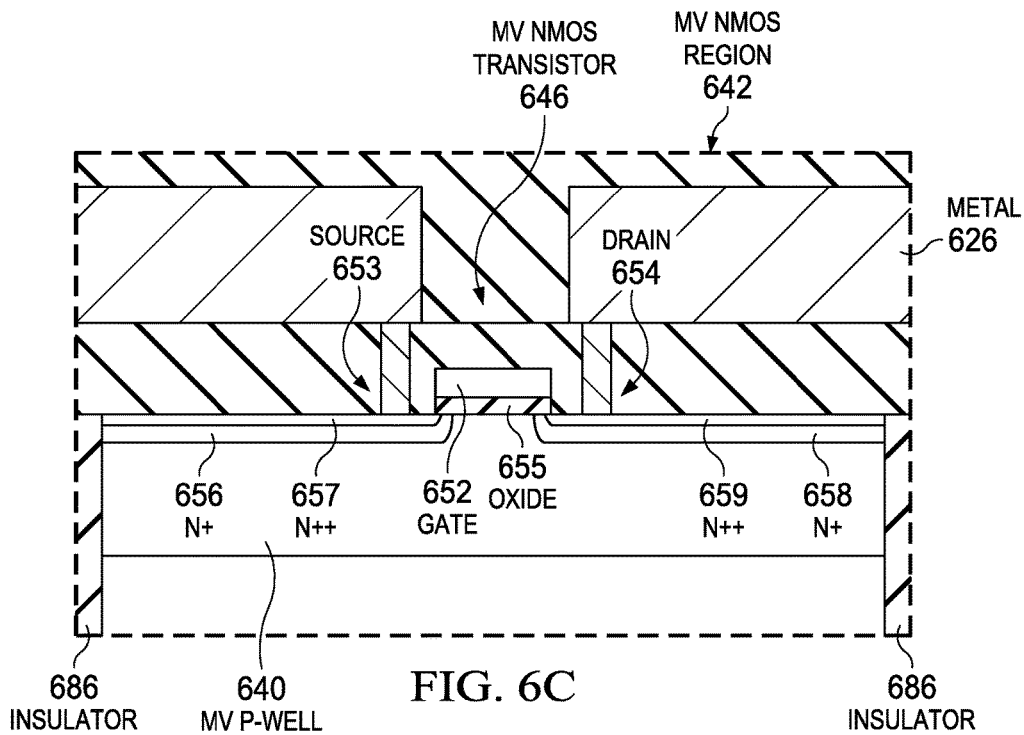
FIG. 6C is a cross section of an MV NMOS region.

FIG. 6C is a cross section of MV NMOS region 642. MV NMOS region 642 is formed at a top surface of a wafer in epitaxial silicon 610. MV NMOS region 642 is surrounded by insulator 686 to isolate the electrical circuitry formed on and within MV NMOS region 642. MV NMOS region 642 uses a medium voltage level and includes transistor 646. MV P-well 640 does not include wells of other semiconductor doping types and concentrations. Alternative embodiments of MV P-well 640 can include wells of other semiconductor doping types and concentrations.

Transistor 646 includes gate 652 that is separated from MV NMOS region 642 formed in epitaxial silicon 610 by oxide 655. Transistor 646 includes source 653 formed by N++ layer 657 and N+ layer 656. Transistor 646 includes drain 654 formed by N++ layer 659 and N+ layer 658.

Figure 6D:
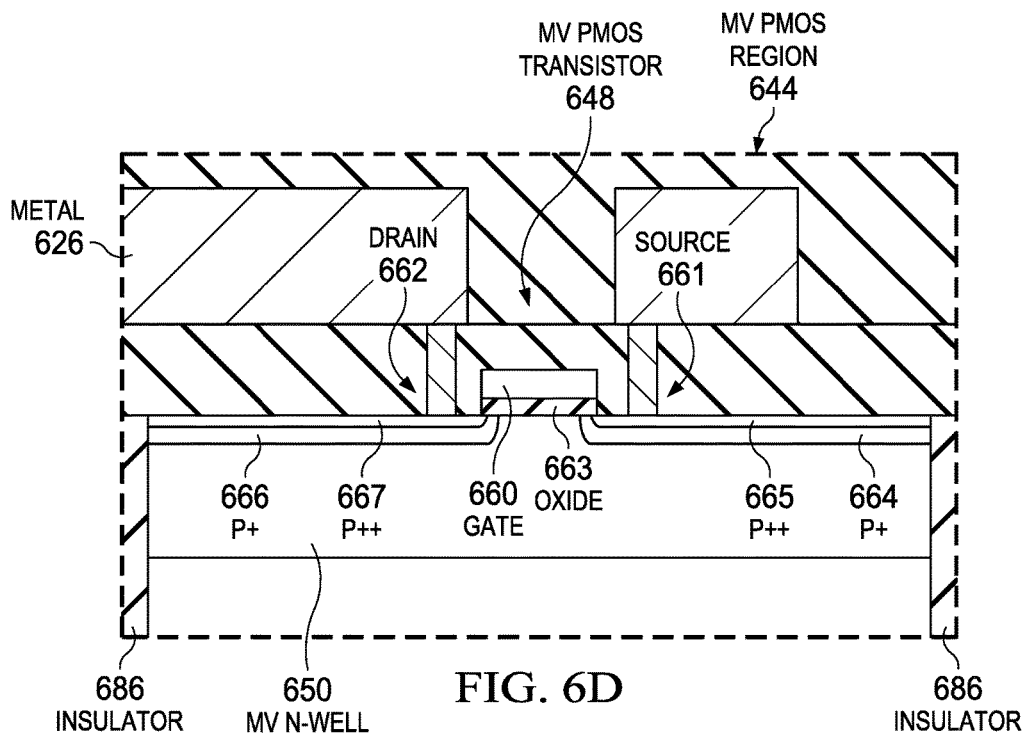
FIG. 6D is a cross section of an MV PMOS region.

FIG. 6D is a cross section of MV PMOS region 644. MV PMOS region 644 is formed at a top surface of a wafer in epitaxial silicon 610. MV PMOS region 644 is surrounded by insulator 686 to isolate the electrical circuitry formed on and within MV PMOS region 644. MV PMOS region 644 uses a medium voltage level and includes transistor 648. MV N-well 650 does not include wells of other semiconductor doping types and concentrations. Alternative embodiments of MV N-well 650 use wells of other semiconductor doping types and concentrations formed within MV N-well 650.

Transistor 648 includes gate 660 that is separated from MV PMOS region 644 formed in epitaxial silicon 610 by oxide 663. Transistor 648 includes source 661 formed by P++ layer 665 and P+ layer 664. Transistor 648 includes drain 662 formed by P++ layer 665 and P+ layer 664.

Drain 654 of transistor 646 and drain 662 of transistor 648 are connected by metal 626. In one embodiment, gate 652 of transistor 646 and gate 660 of transistor 648 are electrically connected to form an input of a CMOS inverter with drain 654 of transistor 646 and drain 662 of transistor 648 forming the output of the CMOS inverter.

Figure 6E:
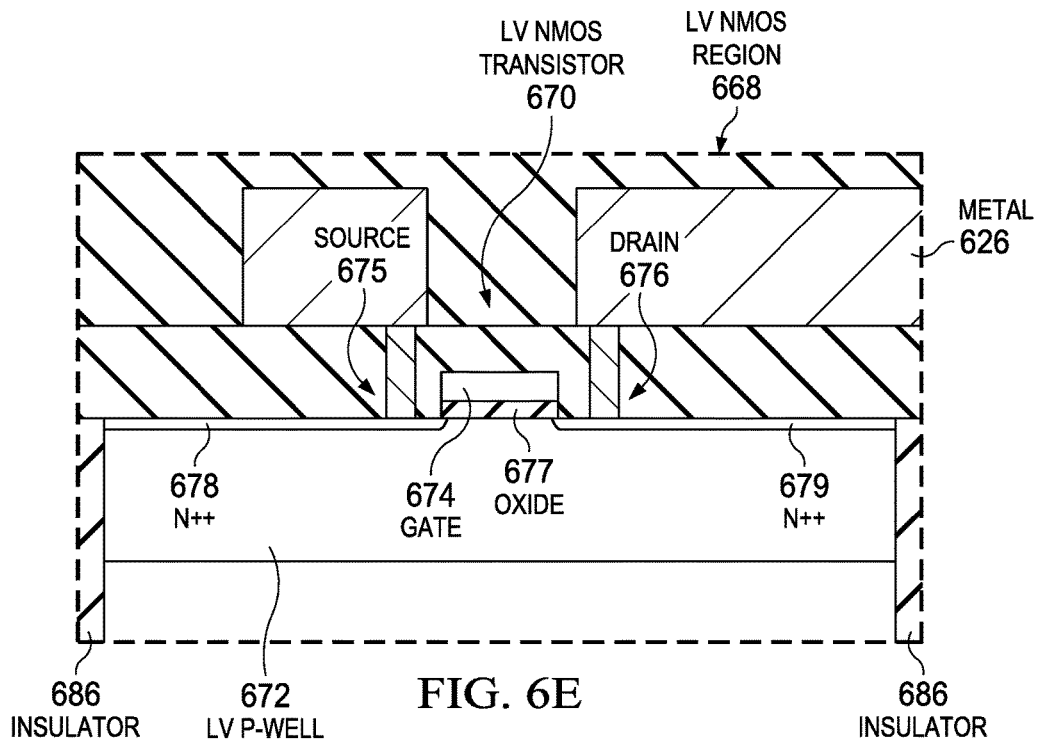
FIG. 6E is a cross section of an LV NMOS region.

FIG. 6E is a cross section of LV NMOS region 668. LV NMOS region 668 is formed at a top surface of a wafer in epitaxial silicon 610. LV NMOS region 668 is surrounded by insulator 686 to isolate the electrical circuitry formed on and within LV NMOS region 668. LV NMOS region 668 uses a low voltage level and includes transistor 670. LV P-well 672 does not include wells of other semiconductor doping types and concentrations. Alternative embodiments of LV P-well 672 can include wells of other semiconductor doping types and concentrations.

Transistor 670 includes gate 674 that is separated from LV NMOS region 668 formed in epitaxial silicon 610 by oxide 677. Transistor 670 includes source 675 formed by N++ layer 678. Transistor 670 includes drain 676 formed by N++ layer 679.

Figure 6F:
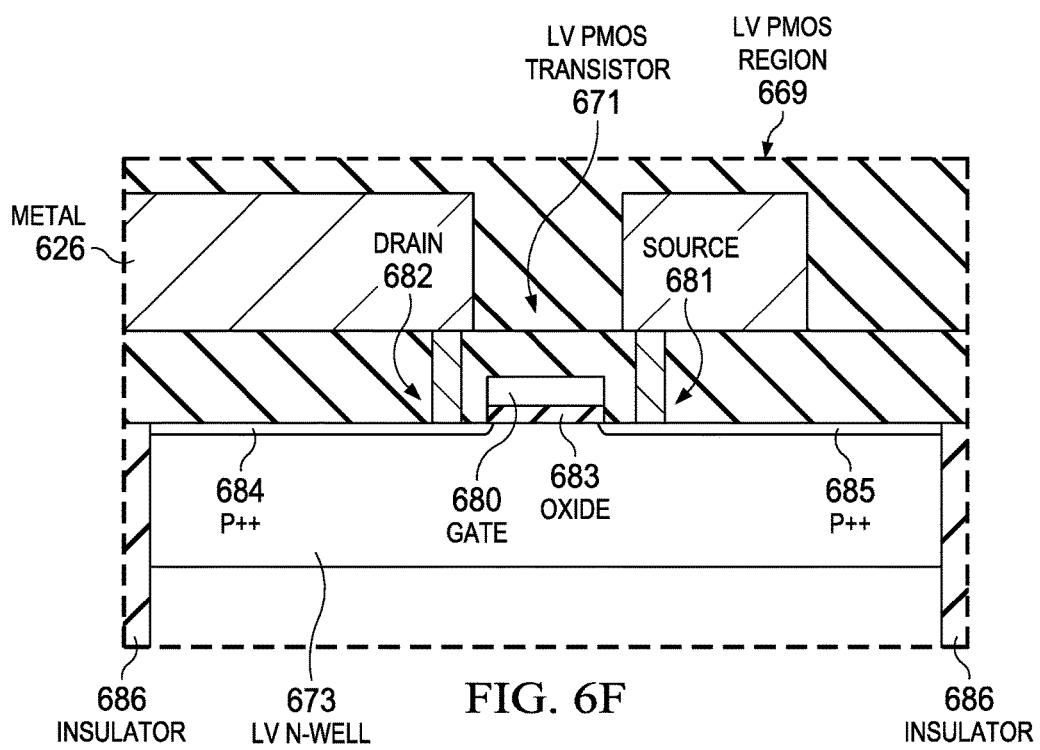
FIG. 6F is a cross section of an LV PMOS region.

FIG. 6F is a cross section of LV PMOS region 669. LV PMOS region 669 is formed at a top surface of a wafer in epitaxial silicon 610. LV PMOS region 669 is surrounded by insulator 686 to isolate the electrical circuitry formed on and within LV PMOS region 669. LV PMOS region 669 uses a low voltage level and includes transistor 671. LV N-well 673 does not include wells of other semiconductor doping types and concentrations. Alternative embodiments of LV N-well 670 use wells of other semiconductor doping types and concentrations formed within LV N-well 670.

Transistor 671 includes gate 680 that is separated from LV PMOS region 669 formed in epitaxial silicon 610 by oxide 683. Transistor 671 includes source 681 formed by P++ layer 685. Transistor 671 includes drain 682 formed by P++ layer 684. For clarity, the intermediate metal layers and contacts to the gates are not shown.

Drain 676 of transistor 670 and drain 682 of transistor 671 are connected by metal 626. In one embodiment, gate 674 of transistor 670 and gate 680 of transistor 671 are electrically connected to from an input of a CMOS inverter with drain 676 of transistor 670 and drain 682 of transistor 671 forming the output of the CMOS inverter.

Figure 7A:
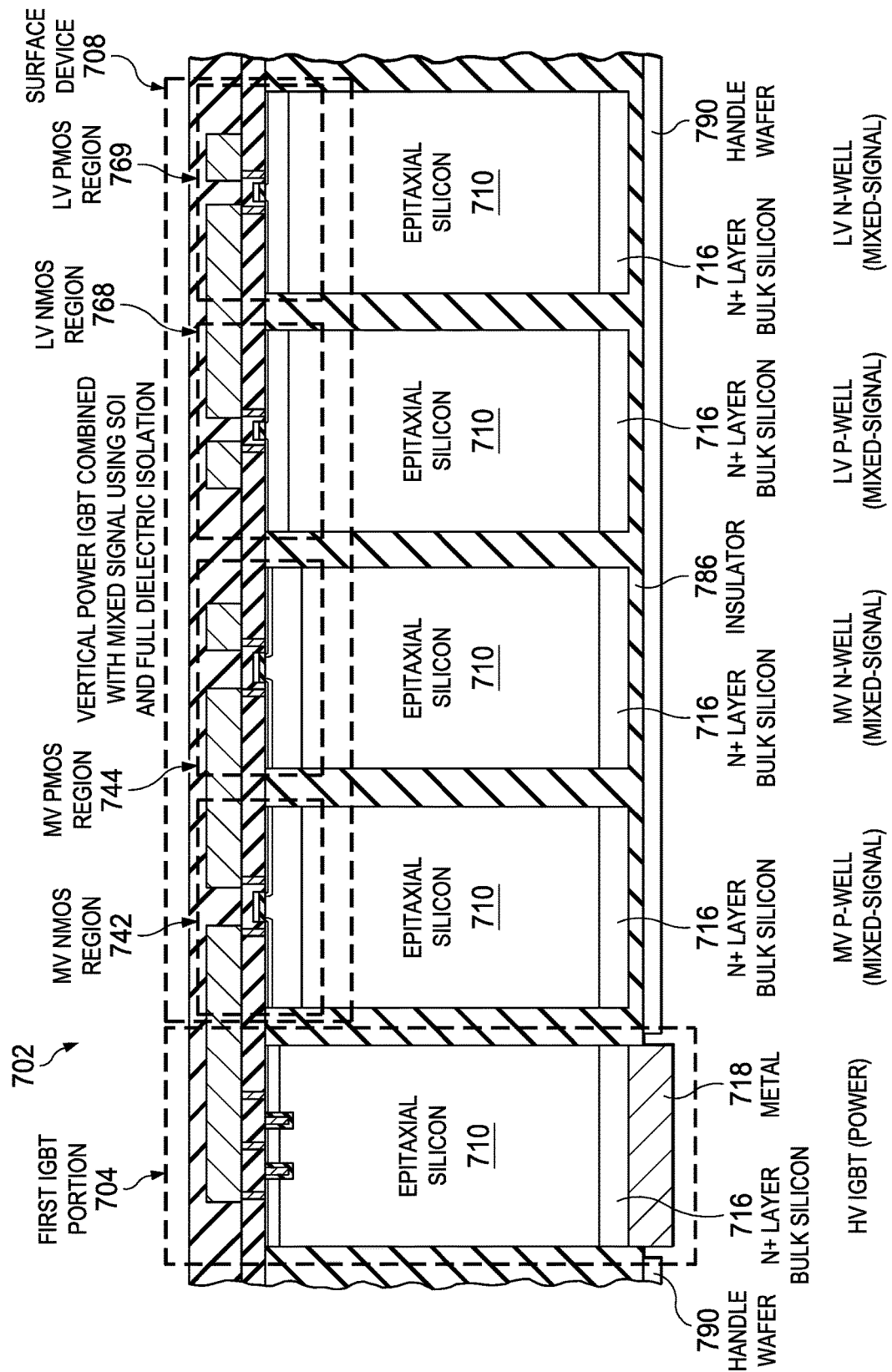
FIG. 7A is a cross sectional view of a device that includes a portion of an IGBT and surface device using silicon-on-insulator technology.

FIG. 7A is a cross sectional view of device 702 that includes first IGBT portion 704 and surface device 708. Device 702 is an embodiment of device 502 of FIG. 5 and differs from device 602 of FIG. 6A in that the vertical power device in the embodiment of FIG. 7A is a vertical power IGBT whereas the vertical power device in the embodiment of FIG. 6A is a vertical power SJMOSFET. Handle wafer 790 supports device 702 during handling and processing.

Surface device 708 is similar in form and function as surface device 608 of FIG. 6A and includes MV NMOS region 742, MV PMOS region 744, LV NMOS region 768, and LV PMOS region 769. Each of MV NMOS region 742, MV PMOS region 744, LV NMOS region 768, and LV PMOS region 769 are surrounded by insulator 786. Each of MV NMOS region 742, MV PMOS region 744, LV NMOS region 768, and LV PMOS region 769 comprise a transistor formed on top of epitaxial silicon 710. In alternative embodiments, any number of MOS regions that each include any number of electrical components are combined to form surface device 708, which may be used to control one or more vertical power devices.

Figure 7B:
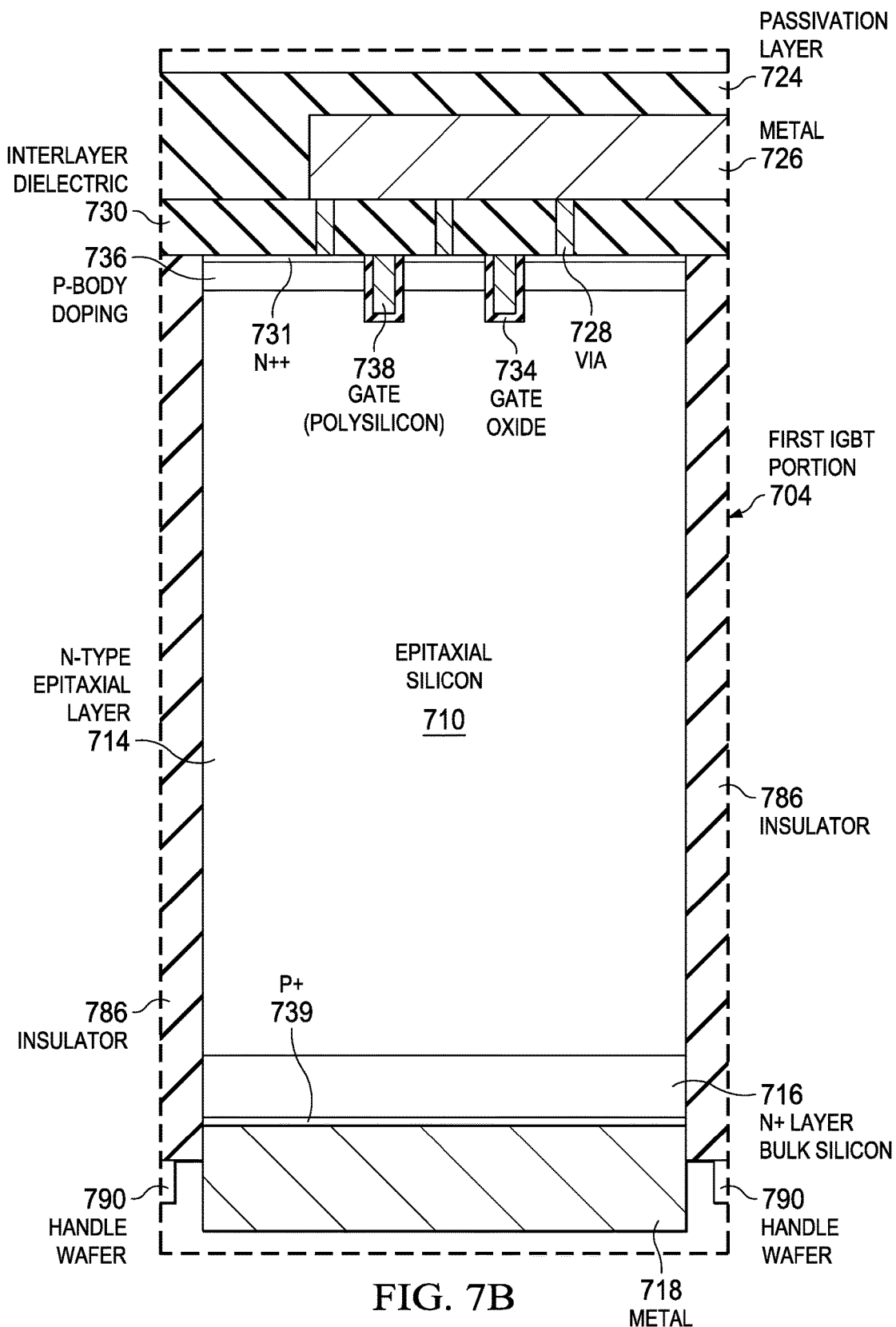
FIG. 7B is a cross sectional view of a vertical IGBT.

FIG. 7B is a cross sectional view of a vertical IGBT of device 702. The vertical IGBT of device 702 is a trench gate IGBT that includes gate 738. For clarity, the intermediate metal layers and contacts to the gates are not shown.

Metal 726 interconnects the emitter of IGBT portion 704 to other electronic circuits, including surface device 708. In alternative embodiments, a multi-level metal topology may be used. The multi-level metal topology may use Aluminum (Al) for all layers, or may use Al for the bottommost metal layers combined with Copper (Cu) for the uppermost metal layers so long as the topmost layer is thick enough (about 2-5 micrometers [μm] thick) to handle the high power requirements of the IGBT of device 702. The source of the transistor in MV NMOS region 742 is connected to the emitter of the IGBT of device 702 by metal 726.

Via 728 is made with Tungsten (W) plugs with the contact bottom and sidewalls lined with a barrier layer, such as Titanium (Ti), Titanium Nitride (TiN), or a combination thereof.

ILD 730 is a layer of dielectric material between the top of epitaxial silicon 710 and metal 726. Power devices, such as the IGBT of device 702, typically comprise multiple $SiO_2$ (oxide) layers, with an uncharged, undoped oxide layer (non-plasma-enhanced deposition) nearest the surface, which is followed by doped (e.g., PSG) and plasma-deposited oxides (e.g., PETEOS).

Gate oxide 734 separates gate 738 from N-type epitaxial layer 714 in epitaxial silicon 710 of a wafer.

P-body doping 736 is formed towards a top surface of epitaxial silicon 710 in IGBT portion 704. N++ layer 731 is formed within P-body 736.

Gate 738 comprises polysilicon and a voltage applied to gate 738 controls an amount of current that passes between the emitter and collector of the IGBT of device 702. For clarity in the drawings, the gate contact and control is not shown.

P+ layer 739 forms a P-N junction with N+ layer 316 to form the collector of first IGBT portion 704.

Figure 8A:
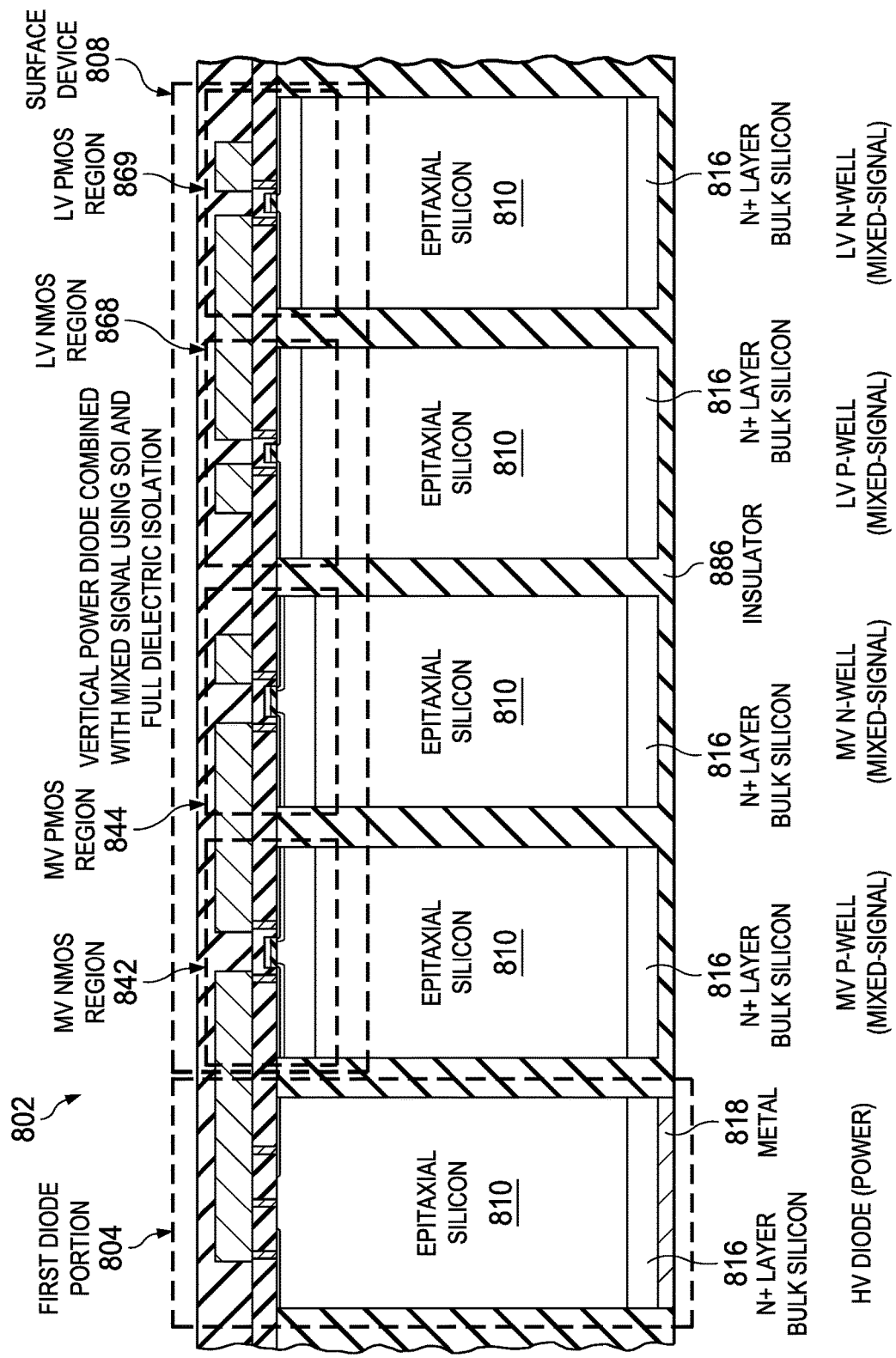
FIG. 8A is a cross sectional view of a device that includes a diode and a surface device using silicon-on-insulator technology.

FIG. 8A is a cross sectional view of device 802 that includes first diode portion 804 and surface device 808. Device 802 is an embodiment of device 502 of FIG. 5 and differs from device 602 of FIG. 6A in that the vertical power device in the embodiment of FIG. 8A is a vertical power diode whereas the vertical power device in the embodiment of FIG. 6A is a vertical power SJMOSFET. Device 802 is shown without a handle wafer.

Surface device 808 is similar in form and function as surface device 608 of FIG. 6A and includes MV NMOS region 842, MV PMOS region 844, LV NMOS region 868, and LV PMOS region 869. Each of MV NMOS region 842, MV PMOS region 844, LV NMOS region 868, and LV PMOS region 869 are surrounded by insulator 886. Each of MV NMOS region 842, MV PMOS region 844, LV NMOS region 868, and LV PMOS region 869 comprise a transistor formed on top of epitaxial silicon 810. In alternative embodiments, any number of MOS regions that each include any number of electrical components are combined to form surface device 808, which may be used to control one or more vertical power devices.

Figure 8B:
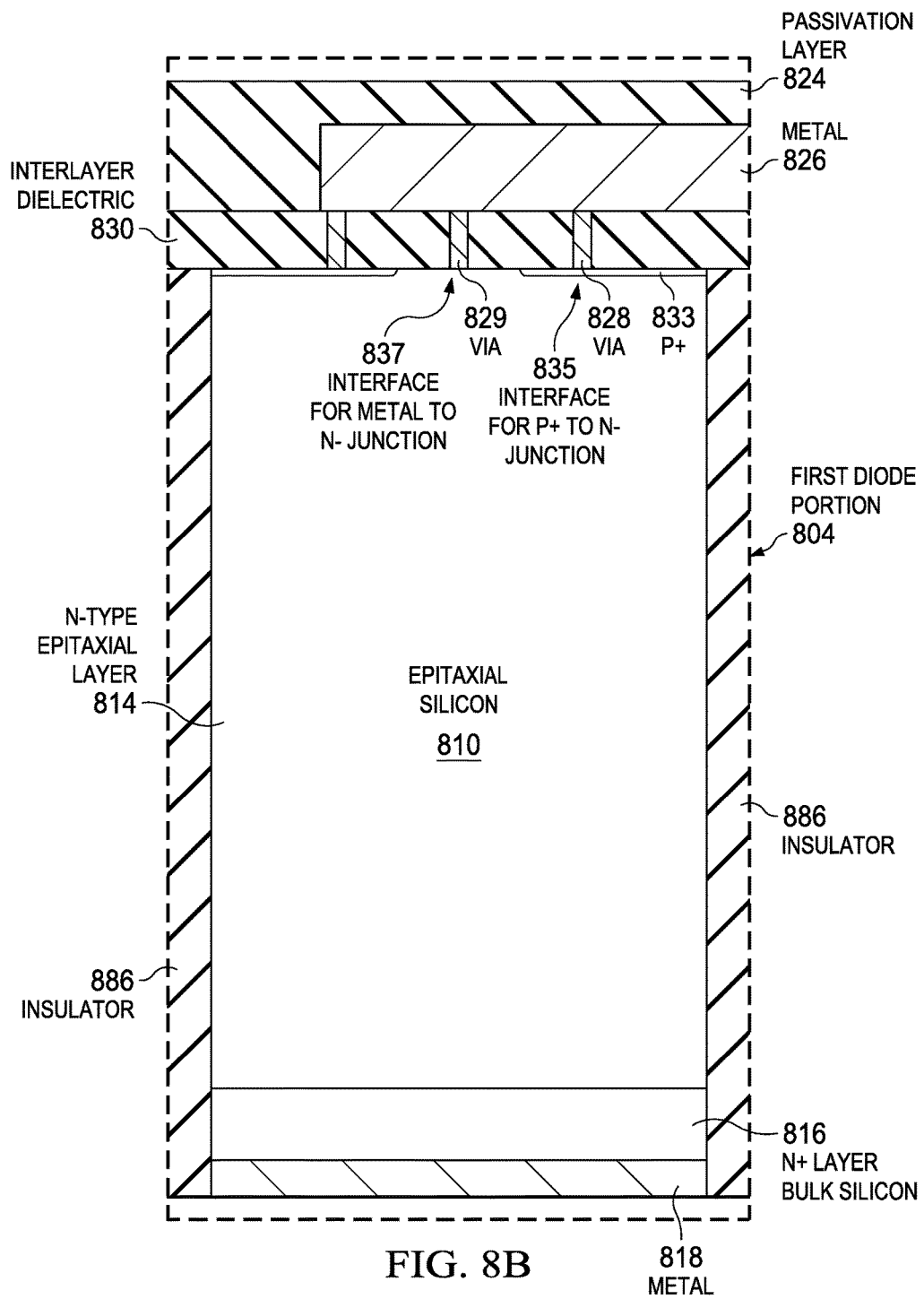
FIG. 8B shows a cross sectional view of a portion of a diode in more detail.

FIG. 8B shows the cross section of diode portion 804 in more detail.

Metal 826 interconnects the anode of diode portion 804 to surface device 802. In alternative embodiments, Metal 826 interconnects the anode of diode portion 804 to the anodes of other diode portions. In other alternative embodiments, a multi-level metal topology may be used. The multi-level metal topology may use Aluminum (Al) for all layers, or may use Al for the bottommost metal layers combined with Copper (Cu) for the uppermost metal layers so long as the topmost layer is thick enough (about 2-5 micrometers [μm] thick) to handle the high power requirements of the diode of device 802.

Via 828 is made with Tungsten (W) plugs with the contact bottom and sidewalls lined with a barrier layer, such as Titanium (Ti), Titanium Nitride (TiN), or a combination thereof.

ILD 830 is a layer of dielectric material that separates metal 826 from the electrically active portions of device 802. Power devices, such as the diode of device 802, typically comprise multiple $SiO_2$ (oxide) layers, with an uncharged, undoped oxide layer (non-plasma-enhanced deposition) nearest the surface, which is followed by doped (e.g., PSG) and plasma-deposited oxides (e.g., PETEOS).

P+ layer 833 is formed towards a top surface of epitaxial silicon 810 in diode portion 804 and is connected to metal 826 by via 828. Interface 835 is the interface between P+ layer 833 and the N– doped epitaxial layer 814 forms a P-N junction to create a silicon junction diode. Interface 837 is the interface between via 829 and the N– doped N-type epitaxial layer 414 that forms a metal-semiconductor junction to create a Schottky barrier for a Schottky diode. In additional embodiments, the diode of device 802 comprises only silicon junction diodes, comprises only Schottky diodes, or any combination of silicon junction diodes and Schottky diodes.

Figure 9:
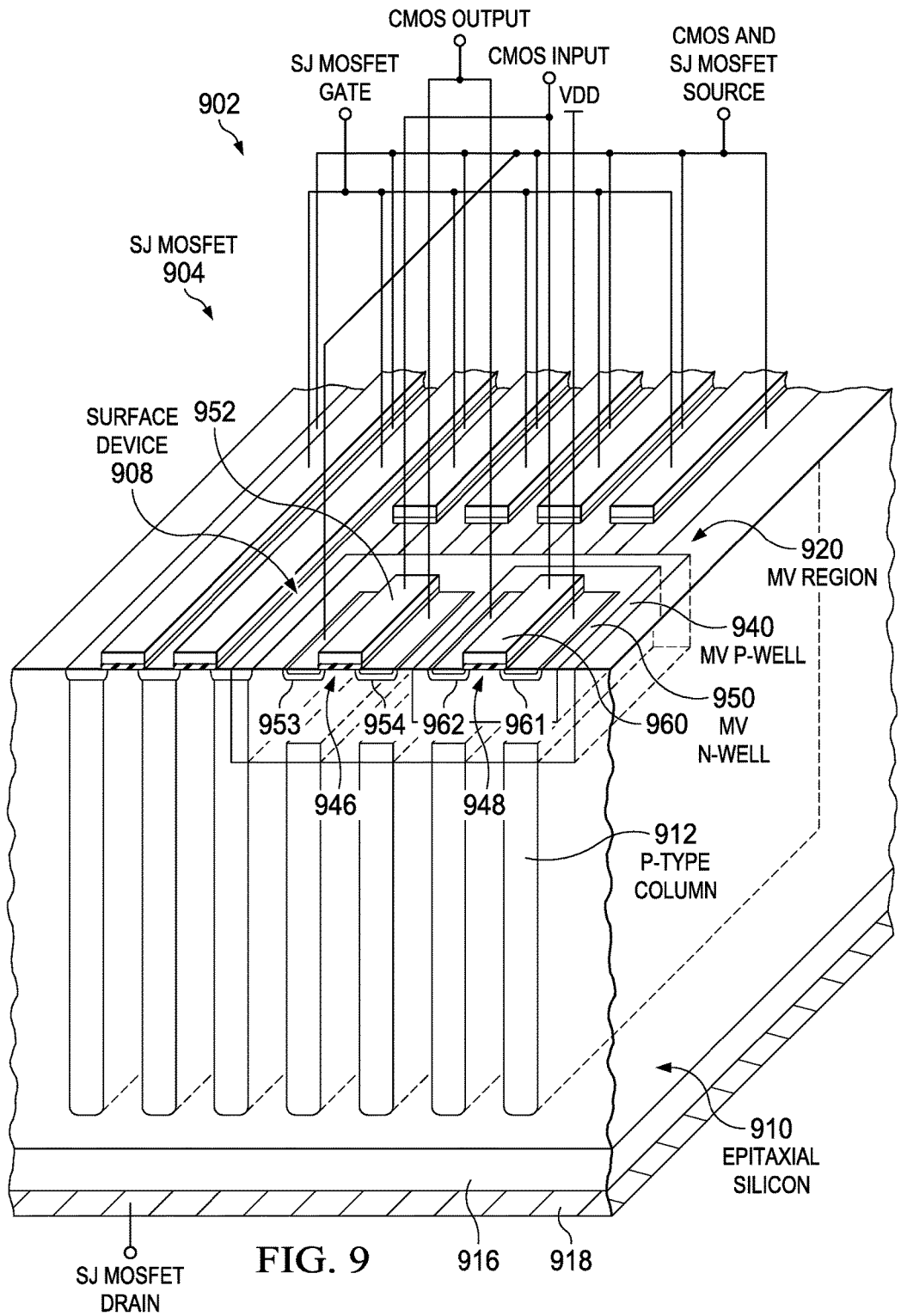
FIG. 9 is a three dimensional view of a device that comprises a vertical power device with a mixed signal surface device.

FIG. 9 is a three dimensional view of device 902 that comprises a vertical power device with a mixed signal surface device. Device 902 is an embodiment of device 502 of FIG. 5.

SJMOSFET 904 is formed in epitaxial silicon 910 with P-type columns 912. The form and function of SJMOSFET 904 is similar to that of the SJMOSFET described in FIG. 2A and FIG. 2B. The gate of SJMOSFET 904 includes several gates that are connected in parallel, some of which are truncated to make room for MV region 920. The drain of SJMOSFET 904 is formed on the bottom or back-side by N+ layer 916, which is connected to metal layer 918.

Surface device 908 includes MV region 920 that comprises a CMOS inverter formed from MV NMOS transistor 946 and MV PMOS transistor 948. Gate 952 of transistor 946 and gate 960 transistor 948 are connected in parallel to form the input to the CMOS inverter. Drain 954 of transistor 946 and drain 962 of transistor 948 are connected together to form the output of the CMOS inverter. Source 953 of transistor 946 is tied to the parallel connected sources of SJMOSFET 904. Source 961 of transistor 948 is connected to voltage $V_{DD}$.

MV NMOS transistor 946 is formed inside of MV P-well 940. MV PMOS transistor 948 is formed inside of MV N-well 950, which is formed in MV P-well 940.

The embodiments presented in this disclosure are intended to provide implementable examples of the present invention, but are not intended to limit the present invention. For example, other materials besides silicon can be used as a base semiconductor material. Various ranges of doping levels for the N-type and P-type regions can be employed as required as well as using P-type bulk silicon or epitaxial layers (rather than N-type) and reversing the dopant types to form complimentary devices, as recognized by one skilled in the art. Various types and thickness of oxide materials can be employed. Various types of gate structures for high voltage devices including both planar gates and trench gates can be employed. Any features, elements, or benefits of any one embodiment may be combined with the features elements and benefits of other embodiments.

The invention claimed is:

1. A semiconductor device comprising:
   epitaxial silicon;
   a surface device formed on the epitaxial silicon;
   a vertical power device that is controlled by the surface device and is formed on the epitaxial silicon;
   an insulator;
   a first part of the epitaxial silicon that is beneath the surface device;
   a second part of the epitaxial silicon in which the vertical power device is formed; and,
   the surface device and the first part of the epitaxial silicon separated from the vertical power device and the second part of the epitaxial silicon by the insulator.

2. The semiconductor device of claim 1 further comprising:
   the vertical power device formed as a superjunction metal oxide semiconductor field effect transistor.

3. The semiconductor device of claim 2 further comprising:
   the vertical power device including one or more power devices in which subsets of the one or more power devices are connected in parallel.

4. The semiconductor device of claim 3 further comprising:
   a wafer on which the semiconductor device is formed and which includes a front-side and a back-side;
   a first metal layer on the front-side of the wafer;
   a second metal layer on the back-side of the wafer; and,
   the vertical power device configured so that power flows between the first metal layer and the second metal layer.

5. The semiconductor device of claim 4 wherein the surface device further comprises:
a set of analog circuits and a set of digital circuits formed by a set of metal oxide semiconductor regions.

6. The semiconductor device of claim 5 wherein the set of metal oxide semiconductor regions further comprises:
a medium voltage N-type metal oxide semiconductor region;
a medium voltage P-type metal oxide semiconductor region;
a low voltage N-type metal oxide semiconductor region; and,
a low voltage P-type metal oxide semiconductor region.

7. The semiconductor device of claim 6 further comprising:
each region of the set of metal oxide semiconductor regions including a set of transistors interconnected by the first metal layer;
a first region of the set of metal oxide semiconductor regions including a set of resistors and capacitors that form a first analog circuit of the set of analog circuits; and,
a second region of the set of metal oxide semiconductor regions that form one or more of the group of logic gates, memory, processors, state machines, erasable programmable read-only memory, and electrically erasable programmable read-only memory.

8. A semiconductor device comprising:
a surface device;
a vertical power device controlled by the surface device;
an insulator;
the surface device and the vertical power device separated by the insulator;
the surface device including a set of analog circuits and a set of digital circuits; and,
the surface device including a set of metal oxide semiconductor regions that form the set of analog circuits and the set of digital circuits.

9. The semiconductor device of claim 8 further comprising:
epitaxial silicon;
the surface device formed on the epitaxial silicon; and,
the vertical power device formed on the epitaxial silicon as an insulated gate bipolar transistor.

10. The semiconductor device of claim 9 further comprising:
the vertical power device including one or more power devices in which subsets of the one or more power devices are connected in parallel;
a wafer on which the semiconductor device is formed and which includes a front-side and a back-side;
a first metal layer on the front-side;
a second metal layer on the back-side; and,
the vertical power device configured so that power flows between the first metal layer and the second metal layer.

11. The semiconductor device of claim 10 wherein the set of metal oxide semiconductor regions further comprises:
a medium voltage N-type metal oxide semiconductor region;
a medium voltage P-type metal oxide semiconductor region;
a low voltage N-type metal oxide semiconductor region; and,
a low voltage P-type metal oxide semiconductor region.

12. The semiconductor device of claim 11 further comprising:
each region of the set of metal oxide semiconductor regions including a set of transistors interconnected by the first metal layer;
a first region of the set of metal oxide semiconductor regions including a set of resistors and capacitors that form a first analog circuit of the set of analog circuits; and,
a second region of the set of metal oxide semiconductor regions that forms one or more logic gates, memory, processors, state machines, erasable programmable read-only memory, and electrically erasable programmable read-only memory.

13. A semiconductor device comprising:
a surface device;
a vertical power device controlled by the surface device and is formed as a power diode;
an insulator;
the surface device and the vertical power device separated by the insulator;
the surface device including a set of analog circuits and a set of digital circuits; and,
the surface device including a set of metal oxide semiconductor regions that form the set of analog circuits and the set of digital circuits.

14. The semiconductor device of claim 13 further comprising:
epitaxial silicon;
the surface device formed on the epitaxial silicon; and,
the vertical power device formed on the epitaxial silicon.

15. The semiconductor device of claim 14 further comprising:
the vertical power device including one or more power devices having one or more subsets;
at least two subsets of the one or more subsets are connected together in parallel;
a wafer on which the semiconductor device is formed and which includes a front-side and a back-side;
a first metal layer on the front-side;
a second metal layer on the back-side; and,
the vertical power device configured so that power flows between the first metal layer and the second metal layer.

16. The semiconductor device of claim 15 further wherein the set of metal oxide semiconductor regions includes one or more of the group of a medium voltage N-type metal oxide semiconductor region, a medium voltage P-type metal oxide semiconductor region, a low voltage N-type metal oxide semiconductor region, and a low voltage P-type metal oxide semiconductor region.

17. The semiconductor device of claim 16 further comprising:
each region of the set of metal oxide semiconductor regions including a set of transistors interconnected by the first metal layer;
a first region of the set of metal oxide semiconductor regions including a set of resistors and capacitors that form a first analog circuit of the set of analog circuits and digital circuits; and,
a second region of the set of metal oxide semiconductor regions forming one or more of the group of logic gates, memory, processors, state machines, erasable programmable read-only memory, and electrically erasable programmable read-only memory.

* * * * *